United States Patent
Huang

(10) Patent No.: US 11,562,958 B2
(45) Date of Patent: Jan. 24, 2023

(54) METHOD FOR FABRICATING SEMICONDUCTOR DEVICE

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/516,675

(22) Filed: Nov. 1, 2021

(65) Prior Publication Data

US 2022/0059448 A1 Feb. 24, 2022

Related U.S. Application Data

(62) Division of application No. 16/596,057, filed on Oct. 8, 2019, now Pat. No. 11,264,323.

(51) Int. Cl.
| | |
|---|---|
| *H01L 23/528* | (2006.01) |
| *H01L 23/532* | (2006.01) |
| *H01L 49/02* | (2006.01) |
| *H01L 21/311* | (2006.01) |
| *H01L 21/768* | (2006.01) |
| *H01L 21/321* | (2006.01) |
| *H01L 27/108* | (2006.01) |

(52) U.S. Cl.
CPC ...... *H01L 23/528* (2013.01); *H01L 23/53295* (2013.01); *H01L 27/10814* (2013.01); *H01L 27/10823* (2013.01); *H01L 27/10852* (2013.01); *H01L 27/10885* (2013.01); *H01L 28/90* (2013.01); *H01L 21/31116* (2013.01); *H01L 21/31144* (2013.01); *H01L 21/3212* (2013.01); *H01L 21/7684* (2013.01); *H01L 21/76802* (2013.01); *H01L 21/76834* (2013.01); *H01L 21/76877* (2013.01)

(58) Field of Classification Search
CPC ............ H01L 23/528; H01L 23/53295; H01L 27/10814; H01L 27/10823; H01L 27/10852; H01L 27/10885; H01L 28/90; H01L 21/31116; H01L 21/31144; H01L 21/3212; H01L 21/76802; H01L 21/76834; H01L 21/7684; H01L 21/76877; H01L 27/10855; H01L 21/76807; H01L 23/485; H01L 2221/1063; H01L 21/7682; H01L 21/76831; H01L 27/10873; H01L 23/5283; H01L 27/10847; H01L 27/10888
See application file for complete search history.

(56) References Cited

U.S. PATENT DOCUMENTS

| | | | | |
|---|---|---|---|---|
| 2007/0170547 | A1* | 7/2007 | Chang | H01L 23/522 257/532 |
| 2013/0256769 | A1* | 10/2013 | Jeong | H01L 27/10885 257/296 |
| 2013/0343113 | A1* | 12/2013 | Matsuda | G11C 11/161 365/69 |

* cited by examiner

*Primary Examiner* — Jonathan Han
(74) *Attorney, Agent, or Firm* — Xuan Zhang

(57) ABSTRACT

The present application discloses a method for fabricating a semiconductor device. The method includes providing a substrate comprising a central array area and a marginal array area surrounding the central array area; concurrently forming a first bit line above the central array area and a first dummy bit line above the marginal array area; and concurrently forming a second bit line above the central array area and a second dummy bit line above the marginal array area. The second bit line is higher than and offset from the first bit line and the second dummy bit line is directly above the first dummy bit line.

17 Claims, 41 Drawing Sheets

METHOD FOR FABRICATING SEMICONDUCTOR DEVICE

CROSS-REFERENCE TO RELATED APPLICATION

This application is a divisional application of U.S. Non-Provisional application Ser. No. 16/596,057 filed Oct. 8, 2019, which is incorporated herein by reference in its entirety.

TECHNICAL FIELD

The present disclosure relates to a semiconductor device and a method for fabricating the semiconductor device, and more particularly, to a semiconductor device with bit lines having different vertical levels and a method for fabricating the semiconductor device with bit lines having different vertical levels.

DISCUSSION OF THE BACKGROUND

Semiconductor devices are used in a variety of electronic applications, such as personal computers, cellular phones, digital cameras, and other electronic equipment. The dimensions of semiconductor devices are continuously being scaled down to meet the demand for increasing computing ability. However, a variety of issues arise during the scaling-down process and impact the final electrical characteristics, quality, and yield. Therefore, challenges remain in achieving improved quality, yield, and reliability.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate including a central array area and a marginal array area surrounding the central array area, a first bit line positioned above the central array area, a second bit line positioned above the central array area and higher than and offset from the first bit line, a first dummy bit line positioned above the marginal array area, and a second dummy bit line positioned directly above the first dummy bit line.

In some embodiments, the first bit line comprises a first bit line bottom conductive layer positioned above the central array area and a first bit line top conductive layer positioned on the first bit line bottom conductive layer.

In some embodiments, the semiconductor device further comprises a first bit line contact positioned below the first bit line, wherein a lower portion of the first bit line contact is buried in the substrate.

In some embodiments, the semiconductor device further comprises a first bit line capping layer positioned above the first bit line, wherein the first bit line capping layer is formed of silicon oxide, silicon nitride, silicon oxynitride, silicon nitride oxide, or fluoride-doped silicate.

In some embodiments, the semiconductor device further comprises first bit line spacers attached to sidewalls of the first bit line, wherein the first bit line spacers are formed of silicon oxide, silicon nitride, silicon oxynitride, or silicon nitride oxide.

In some embodiments, the semiconductor device further comprises a plurality of word lines positioned in the central array area.

In some embodiments, the semiconductor device further comprises a plurality of air gaps positioned adjacent to sidewalls of the second bit line and sidewalls of the second dummy bit line.

In some embodiments, the semiconductor device further comprises a plurality of covering spacers positioned adjacent to the sidewalls of the second bit line and the sidewalls of the second dummy bit line, wherein the plurality of covering spacers are formed of silicon oxide, silicon nitride, silicon oxynitride, or silicon nitride oxide.

In some embodiments, the semiconductor device further comprises a plurality of liners positioned between the sidewalls of the second bit line and the plurality of covering spacers and between the sidewalls of the second dummy bit line and the plurality of covering spacers.

In some embodiments, the semiconductor device further comprises a plurality of capacitor structures positioned above the central array area and the marginal array area.

In some embodiments, the semiconductor device further comprises a plurality of capacitor plugs positioned between the plurality of capacitor structures and the substrate.

In some embodiments, the semiconductor device further comprises a second bit line contact positioned above the central array area, wherein the second bit line is asymmetrically positioned on the second bit line contact.

In some embodiments, the semiconductor device further comprises a second bit line contact positioned below the second bit line, and a plurality of sacrificial spacers positioned adjacent to sidewalls of the second bit line contact, wherein the plurality of sacrificial spacers may be formed of doped oxide.

T In some embodiments, the semiconductor device further comprises a plurality of covering spacers positioned adjacent to the sidewalls of the second bit line, the sidewalls of the second dummy bit line, and the sidewalls of the second bit line contact.

In some embodiments, the semiconductor device further comprises a plurality of liners positioned between the sidewalls of the second bit line and the plurality of covering spacers, between the sidewalls of the second dummy bit line and the plurality of covering spacers, and between the sidewalls of the second bit line contact and the plurality of covering spacers.

In some embodiments, the plurality of word lines comprise a plurality of word line insulating layers inwardly positioned in the central array area, a plurality of word line electrodes positioned on the plurality of word line insulating layers, and a plurality of word line capping layers positioned on the plurality of word line electrodes.

In some embodiments, the plurality of capacitor structures comprises a plurality of capacitor bottom electrodes inwardly positioned above the substrate, a capacitor insulating layer positioned on the plurality of capacitor bottom electrodes, and a capacitor top electrode positioned on the capacitor insulating layer.

Another aspect of the present disclosure provides a method for fabricating a semiconductor device including providing a substrate comprising a central array area and a marginal array area surrounding the central array area, concurrently forming a first bit line located above the central array area and a first dummy bit line located above the marginal array area, and concurrently forming a second bit line located above the central array area and a second dummy bit line located above the marginal array area, wherein the second bit line is higher than and offset from the first bit line and the second dummy bit line is directly above the first dummy bit line.

In some embodiments, the method for fabricating the semiconductor device further comprises forming a plurality of air gaps adjacent to sidewalls of the second bit line and the second dummy bit line.

In some embodiments, the method for fabricating the semiconductor device further comprises forming a plurality of capacitor structures located at the central array area.

Due to the design of the semiconductor device of the present disclosure, the distance between the first bit line and the second bit line may be increased; therefore, the resistive-capacitive delay induced by the parasitic capacitance originating from adjacent bit lines may be alleviated.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
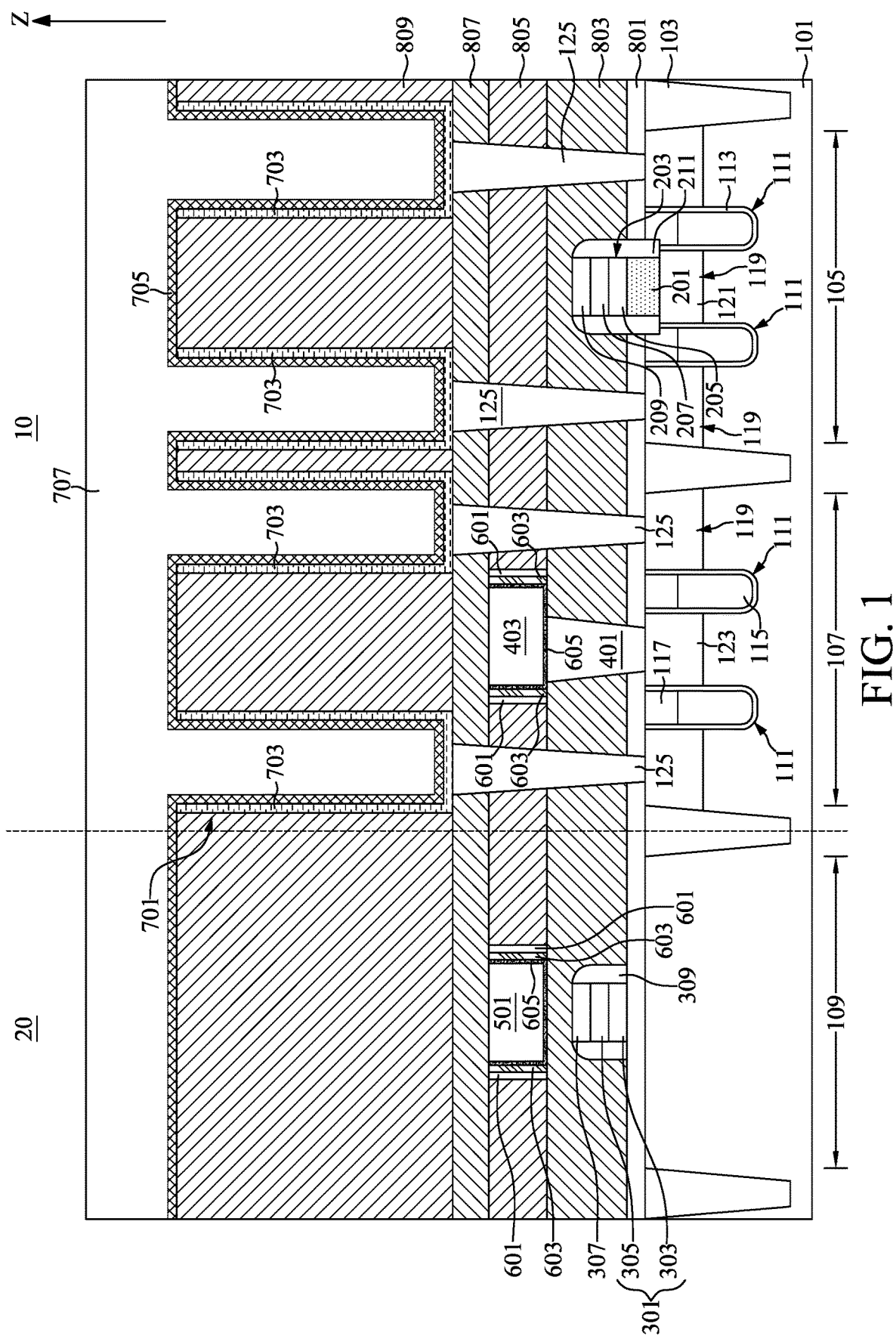
FIG. 1 illustrates, in a schematic cross-sectional view diagram, a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It will be understood that when an element or layer is referred to as being "connected to," or "coupled to" another element or layer, it can be directly connected to or coupled to another element or layer or intervening elements or layers may be present.

It will be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device. Specifically, semiconductor devices of embodiments of the present disclosure may be dynamic random-access memory devices.

It should be noted that, in the description of the present disclosure, above (or up) corresponds to the direction of the arrow of the direction Z, and below (or down) corresponds to the opposite direction of the arrow of the direction Z.

Figure 2:
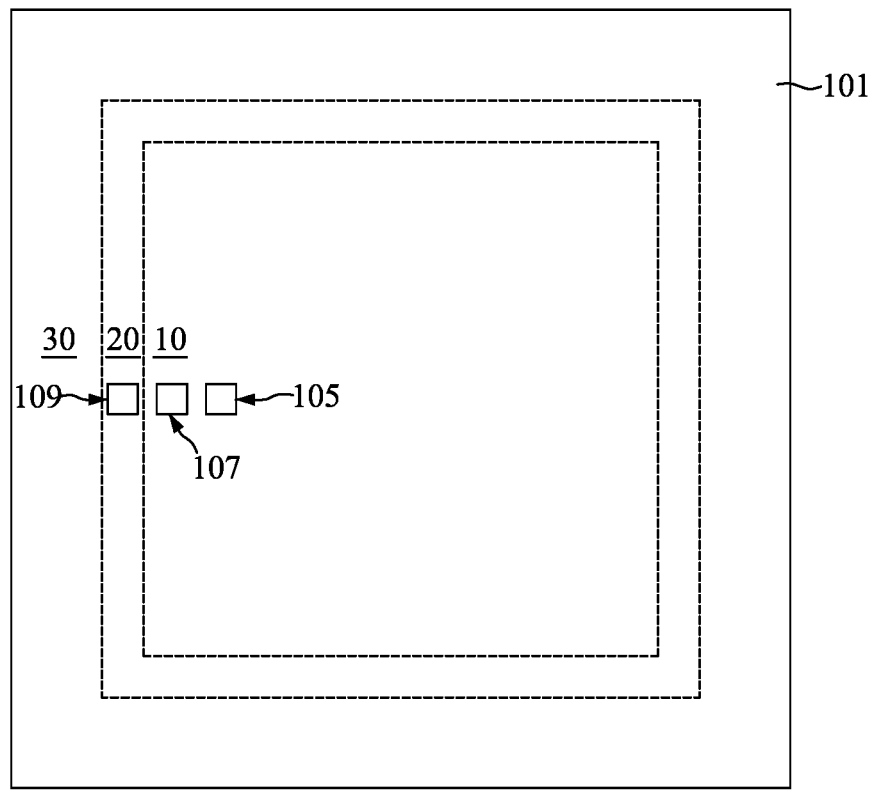
FIG. 2 illustrates, in a schematic top-view diagram, the semiconductor device in accordance with one embodiment of the present disclosure.

FIG. 1 illustrates, in a schematic cross-sectional view diagram, a semiconductor device in accordance with one embodiment of the present disclosure. FIG. 2 illustrates, in a schematic top-view diagram, the semiconductor device in accordance with one embodiment of the present disclosure.

With reference to FIGS. 1 and 2, in the embodiment depicted, the semiconductor device may include a substrate 101, an isolation layer 103, a plurality of word lines 111, a plurality of doped regions 119, a first bit line contact 201, a first bit line 203, a first bit line capping layer 209, a first bit line spacer 211, a first dummy bit line 301, a first dummy capping layer 307, a first dummy bit line spacer 309, a second bit line contact 401, a second bit line 403, a second dummy bit line 501, a plurality of air gaps 601, a plurality of covering spacers 603, a plurality of liners 605, a plurality of capacitor structures 701, a buffer layer 801, and a plurality of insulating films.

With reference to FIGS. 1 and 2, in the embodiment depicted, the substrate 101 may be formed of, for example, silicon, germanium, silicon germanium, silicon carbon, silicon germanium carbon, gallium, gallium arsenic, indium arsenic, indium phosphorus or other IV-IV, III-V or II-VI semiconductor materials. The substrate 101 may include a central array area 10, a marginal array area 20, and a peripheral area 30. The marginal array area 20 may surround the central array area 10. The peripheral area 30 may surround the marginal array area 20.

With reference to FIGS. 1 and 2, in the embodiment depicted, the isolation layer 103 may be disposed in an upper portion of the substrate 101. The isolation layer 103 may be formed of, for example, an insulating material such as silicon oxide, silicon nitride, silicon oxynitride, silicon nitride oxide, or fluoride-doped silicate. The isolation layer 103 may define a first active region 105, a second active region 107, and a dummy region 109. The first active region 105 and the second active region 107 may be both located at the central array area 10 and next to each other. The dummy region 109 may be located at the marginal array area 20 and adjacent to the second active region 107. Alternatively, in another embodiment, the dummy region 109 may be separate from the second active region 107.

It should be noted that, in the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

With reference to FIGS. 1 and 2, in the embodiment depicted, the plurality of word lines 111 may be disposed in the upper portion of the substrate 101 and located at the first active region 105 and the second active region 107. Specifically, a first adjacent pair of the plurality of word lines 111 may be located at the first active region 105. A second adjacent pair of the plurality of word lines 111 may be located at the second active region 107. The plurality of word lines 111 may include a plurality of word line insulating layers 113, a plurality of word line electrodes 115, and a plurality of word line capping layers 117.

With reference to FIGS. 1 and 2, in the embodiment depicted, the plurality of word line insulating layers 113 may be inwardly disposed in the upper portion of the substrate 101 and located at the first active region 105 and the second active region 107. The plurality of word line insulating layers 113 may be formed of an insulating material having a dielectric constant of about 4.0 or greater. (All dielectric constants mentioned herein are relative to a vacuum unless otherwise noted.) The insulating material having a dielectric constant of about 4.0 or greater may be hafnium oxide, zirconium oxide, aluminum oxide, titanium oxide, lanthanum oxide, strontium titanate, lanthanum aluminate, yttrium oxide, gallium (III) trioxide, gadolinium gallium oxide, lead zirconium titanate, barium strontium titanate, or a mixture thereof. Alternatively, in another embodiment, the insulating material may be silicon oxide, silicon nitride, silicon oxynitride, silicon nitride oxide, or the like. The plurality of word line insulating layers 113 may have a thickness between about 0.5 nm and about 10 nm.

With reference to FIGS. 1 and 2, in the embodiment depicted, the plurality of word line electrodes 115 may be respectively correspondingly disposed on the plurality of word line insulating layers 113. The plurality of word line electrodes 207 may be formed of a conductive material such as polysilicon, silicon germanium, metal, metal alloy, metal silicide, metal nitride, metal carbide, or a combination including multilayers thereof. When multilayers are present, a diffusion barrier layer (not shown) such as titanium nitride or tantalum nitride may be disposed between each of the multilayers. The metal may be aluminum, copper, tungsten, or cobalt. The metal silicide may be nickel silicide, platinum silicide, titanium silicide, molybdenum silicide, cobalt silicide, tantalum silicide, tungsten silicide, or the like. The plurality of word line electrodes 207 may have a thickness between about 50 nm and about 500 nm.

With reference to FIGS. 1 and 2, in the embodiment depicted, the plurality of word line capping layers 117 may be respectively correspondingly disposed on the plurality of word line electrodes 207. Top surfaces of the plurality of word line capping layers 209 may be even with a top surface of the substrate 101. The plurality of word line capping layers 209 may be formed of, for example, silicon oxide, silicon nitride, silicon oxynitride, silicon nitride oxide, fluoride-doped silicate, or the like.

With reference to FIGS. 1 and 2, in the embodiment depicted, the plurality of doped regions 119 may be disposed in the substrate 101 and located at the first active region 105 and the second active region 107. Specifically, the plurality of doped regions 119 may be disposed between the plurality of word lines 111 and the isolation layer 103, between the first adjacent pair of the plurality of word lines 111, and between the second adjacent pair of the plurality of word lines 111. The plurality of doped regions 119 may be doped with a dopant such as phosphorus, arsenic, or antimony. The doped region 119 disposed between the first adjacent pair of the plurality of word lines 111 may be regarded hereinafter as a first common doped region 121. The doped region 119 disposed between the second adjacent pair of the plurality of word lines 111 may be regarded hereinafter as a second common doped region 123.

With reference to FIGS. 1 and 2, in the embodiment depicted, the buffer layer 801 may be disposed on the substrate 101. The buffer layer 801 may be a stacked layer or a single layer including silicon oxide, silicon nitride, silicon oxynitride, silicon nitride oxide, fluoride-doped silicate, or the like.

With reference to FIGS. 1 and 2, in the embodiment depicted, the plurality of insulating films may be disposed on the buffer layer 801. The plurality of insulating films may be formed of, for example, silicon nitride, silicon oxide, silicon oxynitride, flowable oxide, tonen silazen, undoped silica glass, borosilica glass, phosphosilica glass, borophosphosilica glass, plasma-enhanced tetra-ethyl orthosilicate, fluoride silicate glass, carbon-doped silicon oxide, xerogel, aerogel, amorphous fluorinated carbon, organo silicate glass, parylene, bis-benzocyclobutenes, polyimide, porous polymeric material, or a combination thereof, but are not limited thereto. The plurality of insulating films may be stacked films including, from bottom to top, a first insulating layer 803, a second insulating layer 805, a third insulating layer 807, and a fourth insulating layer 809.

With reference to FIGS. 1 and 2, in the embodiment depicted, the first bit line contact 201 may be located at the first active region 105 and disposed in the substrate 101 and the buffer layer 801. Specifically, a lower portion of the first bit line contact 201 may be buried in an upper portion of the first common doped region 121. An upper portion of the first bit line contact 201 may be disposed in the buffer layer 801. A top surface of the first bit line contact 201 may be even with a top surface of the buffer layer 801. The first bit line contact 201 may be formed of, for example, doped polysilicon, a metal, or a metal silicide. The first bit line contact 201 may be electrically connected to the first common doped region 121.

With reference to FIGS. 1 and 2, in the embodiment depicted, the first bit line 203 may be disposed in the first insulating layer 803 and on the first bit line contact 201. The first bit line 203 may include a first bit line bottom conductive layer 205 and a first bit line top conductive layer 207. The first bit line bottom conductive layer 205 may be disposed on the first bit line contact 201 and electrically connected to the first bit line contact 201. The first bit line bottom conductive layer 205 may be formed of, for example, doped polysilicon. The first bit line top conductive layer 207 may be disposed on the first bit line bottom conductive layer 205 and electrically connected to the first bit line bottom conductive layer 205. The first bit line top conductive layer 207 may be formed of, for example, copper, nickel, cobalt, aluminum, or tungsten. The first bit line capping layer 209 may be disposed on the first bit line top conductive layer 207 and in the first insulating layer 803. The first bit line capping layer 209 may be formed of, for example, silicon oxide or silicon nitride.

With reference to FIGS. 1 and 2, in the embodiment depicted, the first bit line spacers 211 may be disposed in the first insulating layer 803, the buffer layer 801, and the substrate 101. Specifically, the first bit line spacers 211 may be attached to sidewalls of the first bit line capping layer 209, sidewalls of the first bit line top conductive layer 207, and sidewalls of the first bit line bottom conductive layer 205. That is, the sidewalls of the first bit line capping layer 209, the first bit line top conductive layer 207, and the first bit line bottom conductive layer 205 may be distanced from the first insulating layer 803, and the sidewalls of the first bit line contact 201 may be distanced from the buffer layer 801. Bottom portions of the first bit line spacers 211 may be buried in the first common doped region 121. The first bit line spacers 211 may be disposed on portions of the word line insulating layers 113 of the first adjacent pair of the plurality of word lines 111 and portions of the word line capping layer 117 of the first adjacent pair of the plurality of word lines 111. The first bit line spacers 211 may be formed of, for example, silicon oxide, silicon nitride, silicon oxynitride, or silicon nitride oxide. Alternatively, in another embodiment, the bottom portions of the first bit line spacers 211 may be buried in the first common doped region 121 and may be distanced from the first adjacent pair of the plurality of word lines 111.

With reference to FIGS. 1 and 2, in the embodiment depicted, the first dummy bit line 301 may be located at the dummy region 109 and disposed in the first insulating layer 803. In other words, the first dummy bit line 301 may be located at the marginal array area 20. The first dummy bit line 301 may be disposed on the buffer layer 801. Specifically, the first dummy bit line 301 may include a first dummy bottom conductive layer 303 and a first dummy top conductive layer 305. The first dummy bottom conductive layer 303 may be disposed on the buffer layer 801. The first dummy bottom conductive layer 303 may be formed of a same material as the first bit line bottom conductive layer 205, but is not limited thereto. The first dummy top conductive layer 305 may be disposed on the first dummy bottom conductive layer 303 and electrically connected to the first dummy bottom conductive layer 303. The first dummy top conductive layer 305 may be formed of a same material as the first bit line top conductive layer 207, but is not limited thereto.

With reference to FIGS. 1 and 2, in the embodiment depicted, the first dummy capping layer 307 may be disposed on the first dummy top conductive layer 305 and in the first insulating layer 803. The first dummy capping layer 307 may be formed of a same material as the first bit line capping layer 209, but is not limited thereto. The first dummy bit line spacers 309 may be disposed in the first insulating layer 803 and attached to sidewalls of the first dummy capping layer 307, sidewalls of the first dummy top conductive layer 305, and sidewalls of the first dummy bottom conductive layer 303. Bottoms of the first dummy bit line spacers 309 may directly contact the top surface of the buffer layer 801. The bottoms of the first dummy bit line spacers 309 may be at a vertical level higher than a vertical level of the bottoms of the first bit line spacers 211. In other words, the bottoms of the first dummy bit line spacers 309 may be higher than and offset from the bottoms of the first bit line spacers 211.

With reference to FIGS. 1 and 2, in the embodiment depicted, the second bit line contact 401 may be located at the second active region 107 and disposed in the buffer layer 801 and the first insulating layer 803. Specifically, the second bit line contact 401 may be disposed on the second common doped region 123 and electrically connected to the second common doped region 123. A width of a bottom of the second bit line contact 401 may be less than a width of a top surface of the second bit line contact 401. In other words, a profile of the second bit line contact 401 may be tapered from top to bottom. The second bit line contact 401 may be formed of a conductive material such as doped polysilicon, metal, metal nitride, or metal silicide.

With reference to FIGS. 1 and 2, in the embodiment depicted, the second bit line 403 may be disposed in the second insulating layer 805 and on the second bit line contact 401. The second bit line 403 may be disposed at a vertical level higher than a vertical level of the first bit line 203. Specifically, the second bit line 403 may be disposed at the vertical level higher than a vertical level of the first bit line top conductive layer 207. In other words, the second bit line 403 may be disposed higher than and offset from the first bit line 203 or, specifically, the first bit line top conductive layer 207. Disposing the second bit line 403 and the first bit line 203 at different vertical levels may increase a distance between the second bit line 403 and the first bit line 203 to greater than a distance between the second bit line 403 and the first bit line 203 if the second bit line 403 and the first bit line 203 are disposed at a same vertical level. In addition, the second bit line 403 may be asymmetrically disposed on the second bit line contact 401. For example, only a left portion of a bottom of the second bit line 403 may be disposed on the second bit line contact 401. Disposing of the second bit line 403 asymmetrically on the second bit line contact 401 may further increase separation of the second bit line 403 from semiconductor elements disposed at a left side of the second bit line 403 (e.g., the second dummy bit line 501, which is discussed below); therefore, the interference resulting from the second bit line 403 to such semiconductor elements may be reduced. The second bit line 403 may be formed of a conductive material such as tungsten, aluminum, copper, nickel, or cobalt. The second bit line 403 may be electrically connected to the second bit line contact 401.

With reference to FIGS. 1 and 2, in the embodiment depicted, the second dummy bit line 501 may be disposed at the dummy region 109 and in the second insulating layer 805. The second dummy bit line 501 may be disposed directly above the first dummy bit line 301. The second dummy bit line 501 may be disposed at a same vertical level as the second bit line 403. The second dummy bit line 501 may be formed of a same material as the second bit line 403, but is not limited thereto.

With reference to FIGS. 1 and 2, in the embodiment depicted, the plurality of covering spacers 603 may be respectively correspondingly adjacent to sidewalls of the second bit line 403 and sidewalls of the second dummy bit line 501. The plurality of covering spacers 603 may be formed of, for example, silicon oxide, silicon nitride, silicon oxynitride, or silicon nitride oxide.

With reference to FIGS. 1 and 2, in the embodiment depicted, the plurality of air gaps 601 may be respectively correspondingly adjacent to the sidewalls of the second bit line 403 and the sidewalls of the second dummy bit line 501. Specifically, the plurality of air gaps 601 may be respectively correspondingly adjacent to sidewalls of the plurality of covering spacers 603. The plurality of air gaps 601 may be spaces surrounded by the plurality of covering spacers 603, the third insulating layer 807, the second insulating layer 805, and the first insulating layer 803. Because the plurality of air gaps 601 are filled with air, a dielectric constant of the plurality of air gaps 601 may be significantly lower than the insulating films formed of, for example, silicon oxide. Therefore, the plurality of air gaps 601 may significantly reduce the parasitic capacitance between the second bit line 403 and the second dummy bit line 501. That is, the first insulating layer 803 may significantly alleviate an interference effect between electrical signals induced or applied to the second bit line 403 and the second dummy bit line 501.

With reference to FIGS. 1 and 2, in the embodiment depicted, the plurality of liners 605 may be attached to the sidewalls of the second bit line 403, a bottom of the second bit line 403, the sidewalls of the second dummy bit line 501, and a bottom of the second dummy bit line 501. In other words, the plurality of liners 605 may be respectively correspondingly disposed between the second bit line 403 and the plurality of covering spacers 603 adjacent to the second bit line 403, between the second dummy bit line 501 and the plurality of covering spacers 603 adjacent to the second dummy bit line 501, between the second bit line 403 and the second bit line contact 401, between the second bit line 403 and the first insulating layer 803, and between the second dummy bit line 501 and the first insulating layer 803. The plurality of liners 605 may be formed of, for example, titanium, titanium nitride, titanium silicon nitride, tantalum, tantalum nitride, tantalum silicon nitride, or a combination thereof. The plurality of liners 605 may respectively correspondingly improve adhesion between the aforementioned elements.

With reference to FIGS. 1 and 2, in the embodiment depicted, the plurality of capacitor plugs 125 may be located at the first active region 105 and the second active region 107. The plurality of capacitor plugs 125 may be disposed penetrating through the third insulating layer 807, the second insulating layer 805, the first insulating layer 803, and the buffer layer 801. The plurality of capacitor plugs 125 may be respectively correspondingly electrically connected to the plurality of doped regions 119 except for the first common doped region 121 and the second common doped region 123. The plurality of capacitor plugs 125 may be formed of, for example, doped polysilicon, titanium, titanium nitride, tantalum, tantalum nitride, tungsten, copper, aluminum or aluminum alloy.

With reference to FIGS. 1 and 2, in the embodiment depicted, the plurality of capacitor structures 701 may be located at the first active region 105 and the second active region 107. The plurality of capacitor structures 701 may be disposed in the fourth insulating layer 809 and respectively correspondingly on the plurality of capacitor plugs 125. The plurality of capacitor structures 701 may be electrically connected to the plurality of capacitor plugs 125. The plurality of capacitor structures 701 may include a plurality of capacitor bottom electrodes 703, a capacitor insulating layer 705, and a capacitor top electrode 707.

With reference to FIGS. 1 and 2, in the embodiment depicted, the plurality of capacitor bottom electrodes 703 may be located at the first active region 105 and the second active region 107 and inwardly disposed in the fourth insulating layer 809. Bottoms of the plurality of capacitor bottom electrodes 703 may respectively correspondingly contact top surfaces of the plurality of capacitor plugs 125. The plurality of capacitor bottom electrodes 703 may be formed of, for example, doped polysilicon, metal, or metal silicide. The capacitor insulating layer 705 may be disposed on the plurality of capacitor bottom electrodes 703 and cover a top surface of the fourth insulating layer 809. The capacitor insulating layer 705 may be formed of a single layer including an insulating material having a dielectric constant of about 4.0 or greater. The capacitor insulating layer 705 may have a thickness between about 1 angstrom and about 100 angstroms. Alternatively, in another embodiment, the capacitor insulating layer 705 may be formed of a stacked layer consisting of silicon oxide, silicon nitride, and silicon oxide. The capacitor top electrode 707 may be disposed on the capacitor insulating layer 705. The capacitor top electrode 707 may be formed of, for example, doped polysilicon or metal.

Figure 3:
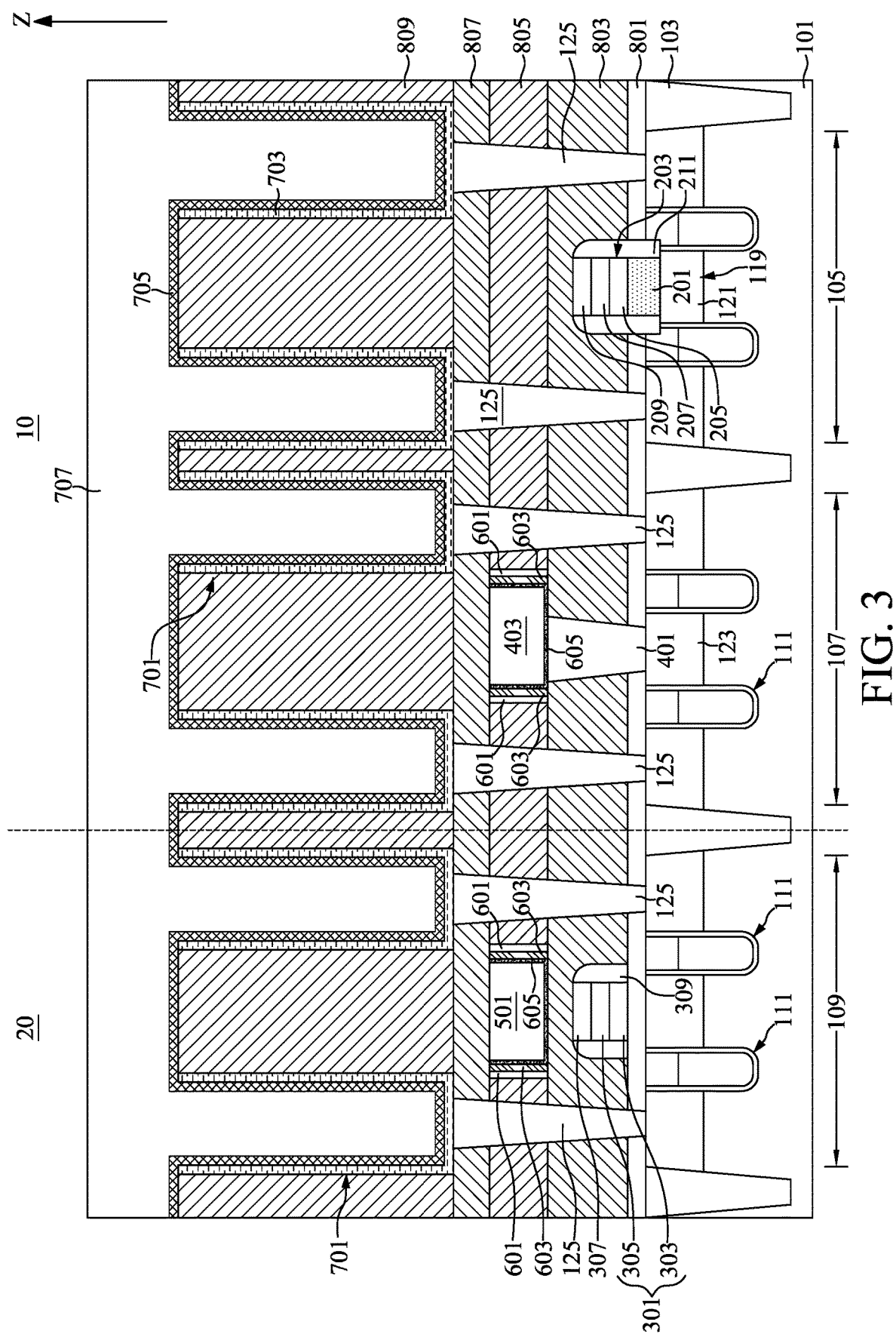
FIGS. 3 and 4 illustrate, in schematic cross-sectional view diagrams, semiconductor devices in accordance with some other embodiments of the present disclosure.
Figure 4:
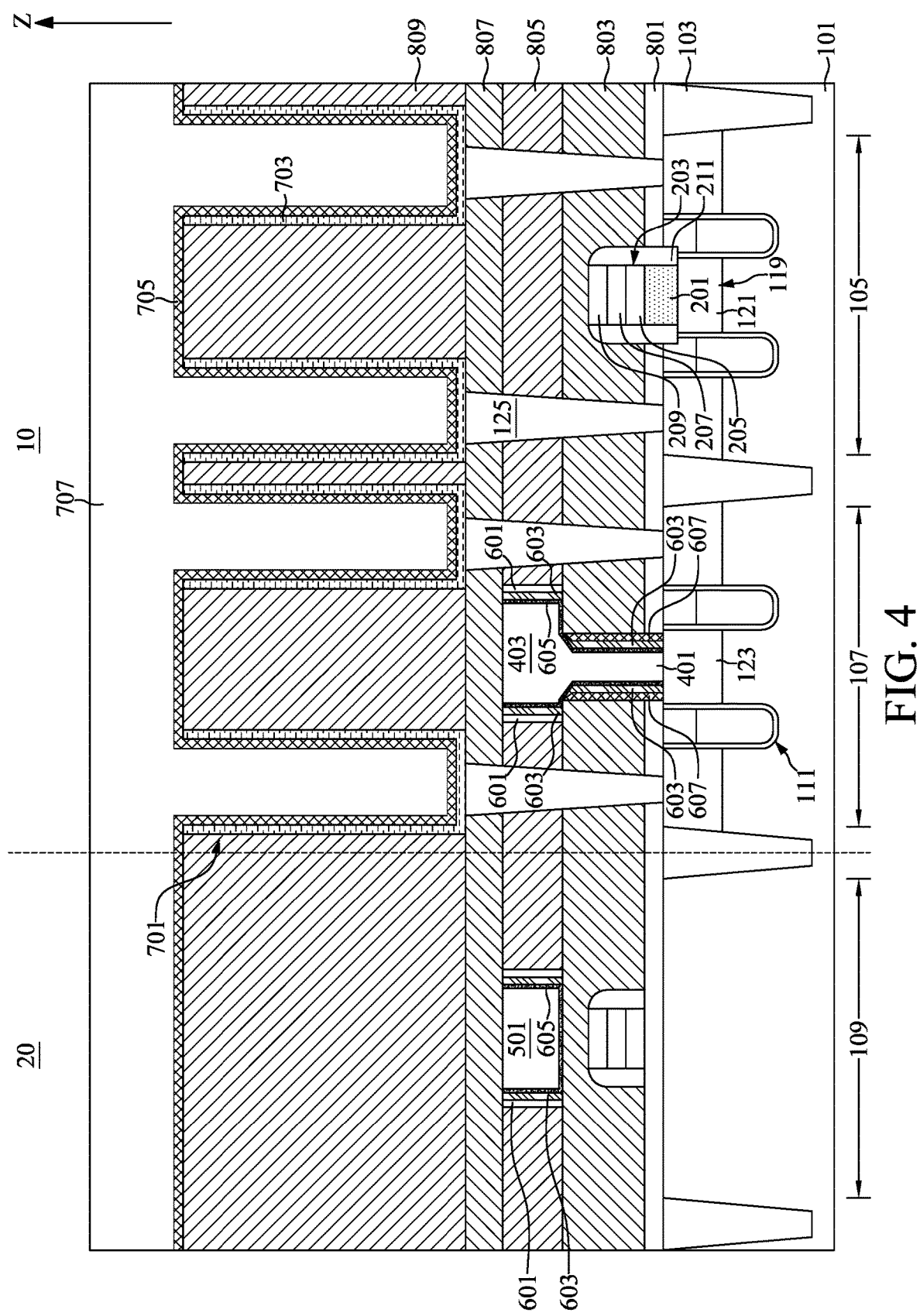

FIGS. 3 and 4 illustrate, in schematic cross-sectional view diagrams, semiconductor devices in accordance with some other embodiments of the present disclosure.

With reference to FIG. 3, in another embodiment, the plurality of word lines 111, the plurality of capacitor plugs 125, and the plurality of capacitor structures 701 may be also located at the dummy region 109. In other words, the plurality of word lines 111, the plurality of capacitor plugs 125, and the plurality of capacitor structures 701 may be also located at the marginal array area 20. The second dummy bit line 501 may not electrically connect to the plurality of word lines 111, the plurality of capacitor plugs 125, or the plurality of capacitor structures 701.

With reference to FIG. 4, in another embodiment, the second bit line 403 may be symmetrically disposed on the second bit line contact 401. The plurality of covering spacers 603 may be adjacent to sidewalls of the second bit line contact 401. The plurality of liners 605 may be disposed between the second bit line contact 401 and the plurality of covering spacers 603 adjacent to the second bit line contact 401. A plurality of sacrificial spacers 607 may be respectively correspondingly disposed adjacent to the plurality of covering spacers 603 disposed adjacent to the second bit line contact 401. In other words, the plurality of sacrificial spacers 607 may be disposed between the first insulating layer 803 and the plurality of covering spacers 603 adjacent to the second bit line contact 401. The plurality of sacrificial spacers 607 may be formed of, for example, doped oxide such as borosilica glass, phosphosilica glass, borophosphosilica glass, fluoride silicate glass, carbon doped silicon oxide, or the like. Alternatively, in another embodiment, the plurality of sacrificial spacers 607 may be formed of a thermal decomposable polymer or a thermal degradable polymer. The thermal decomposable polymer or the thermal degradable polymer decomposes or degrades into a gaseous state when exposed to a temperature exceeding the decomposition temperature of the thermal decomposable polymer or the degradation temperature of the thermal degradable polymer.

Figure 5:
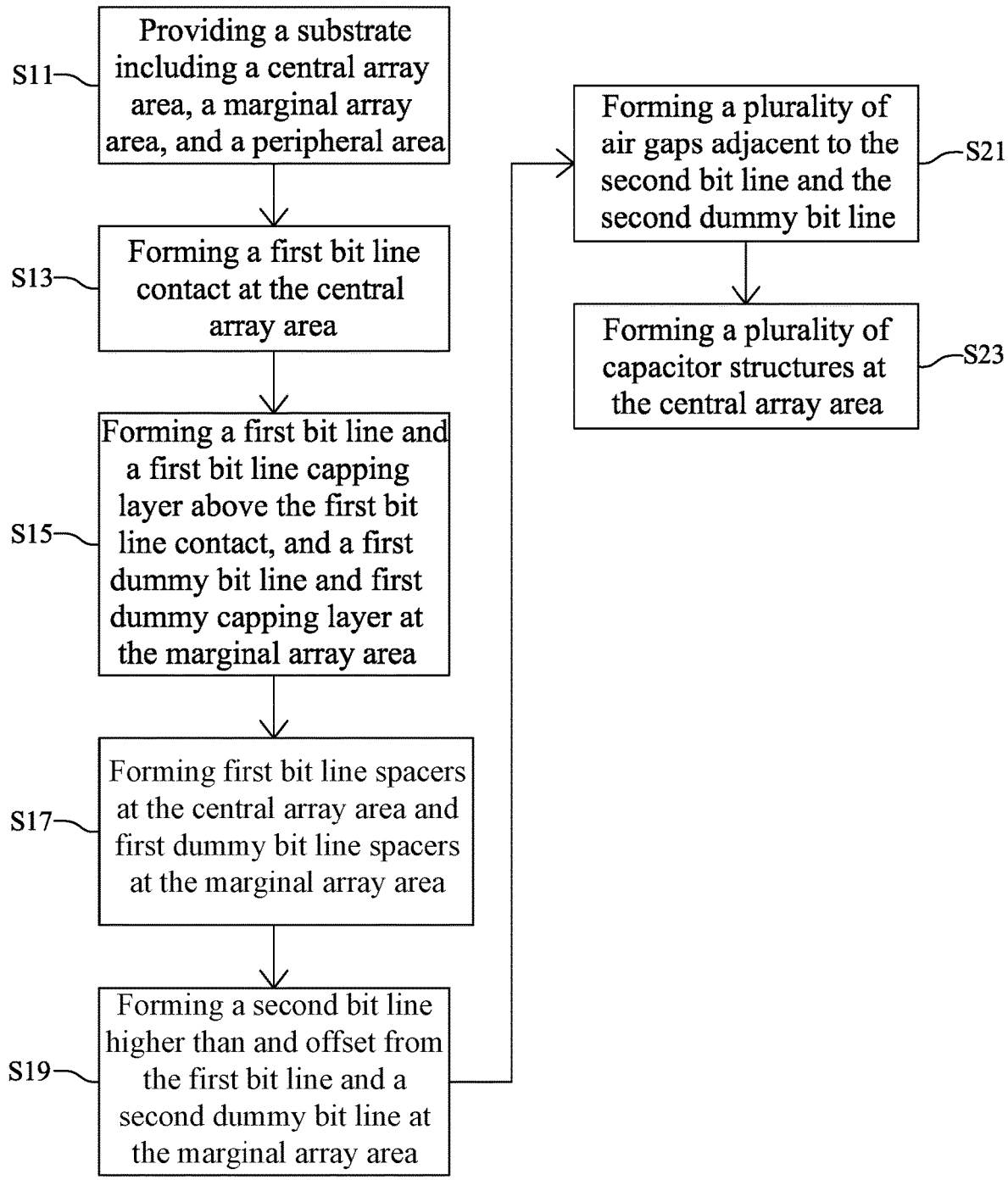
FIG. 5 illustrates, in a flowchart diagram form, a method for fabricating a semiconductor device in accordance with one embodiment of the present disclosure.

FIG. 5 illustrates, in a flowchart diagram form, a method 40 for fabricating a semiconductor device in accordance with one embodiment of the present disclosure. FIGS. 6 to 28 illustrate, in schematic cross-sectional diagrams, a flow of fabricating a semiconductor device in accordance with one embodiment of the present disclosure.

Figure 6:
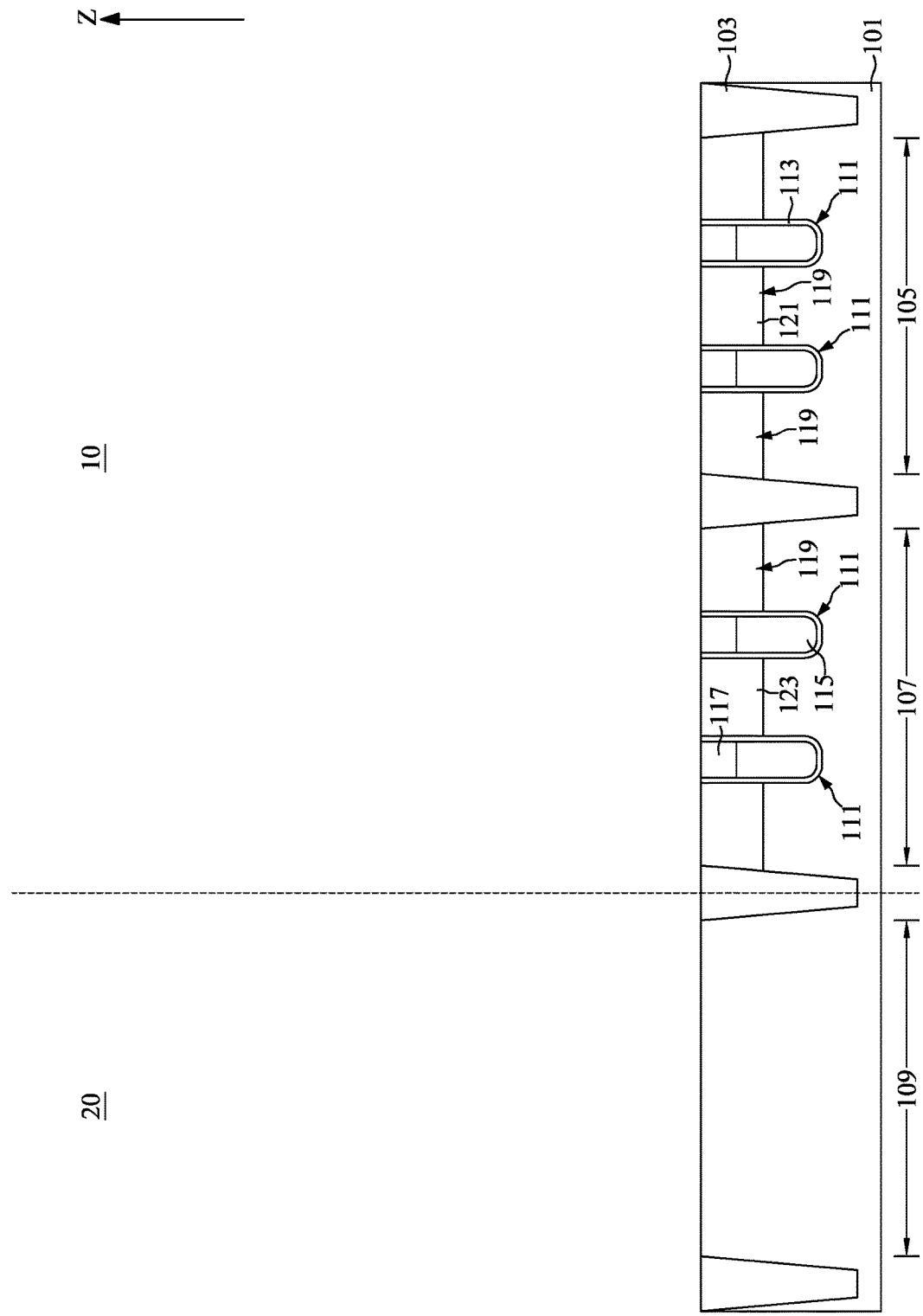
FIGS. 6 to 28 illustrate, in schematic cross-sectional diagrams, a flow of fabricating a semiconductor device in accordance with one embodiment of the present disclosure.

With reference to FIGS. 2, 5 and 6, at step S11, in the embodiment depicted, a substrate 101 may be provided. The substrate 101 may include a central array area 10, a marginal array area 20, and a peripheral area 30. The marginal array area 20 may surround the central array area 10. The peripheral area 30 may surround the marginal array area 20. An isolation layer 103 may be formed in the substrate 101 and define a first active region 105, a second active region 107, and a dummy region 109. The first active region 105 and the second active region 107 may both be located at the central array area 10 and next to each other. The dummy region 109 may be located at the marginal array area 20 and adjacent to the second active region 107.

With reference to FIGS. 5 and 6, a plurality of word lines 111 may be formed in the substrate 101 and located at the first active region 105 and the second active region 107. A plurality of word line insulating layers 113 may be inwardly formed in the substrate 101. A plurality of word line electrodes 115 may be respectively correspondingly formed on the plurality of word line insulating layers 113. A plurality of word line capping layers 117 may be respectively correspondingly formed on the plurality of word line electrodes 115. The plurality of word line insulating layers 113, the plurality of word line electrodes 115, and the plurality of word line capping layers 117 together form the plurality of word lines 111. Specifically, a first adjacent pair of the plurality of word lines 111 may be located at the first active region 105. A second adjacent pair of the plurality of word lines 111 may be located at the second active region 107.

With reference to FIGS. 5 and 6, a plurality of doped regions 119 may be formed in the substrate 101 and located at the first active region 105 and the second active region 107 by an implantation process using, for example, phosphorus, arsenic, or antimony as a dopant. Specifically, the plurality of doped regions 119 may be formed between the plurality of word lines 111 and the isolation layer 103, between the first adjacent pair of the plurality of word lines 111, and between the second adjacent pair of the plurality of word lines 111. The doped region 119 formed between the first adjacent pair of the plurality of word lines 111 may be regarded hereinafter as a first common doped region 121. The doped region 119 formed between the second adjacent pair of the plurality of word lines 111 may be regarded hereinafter as a second common doped region 123.

Figure 7:
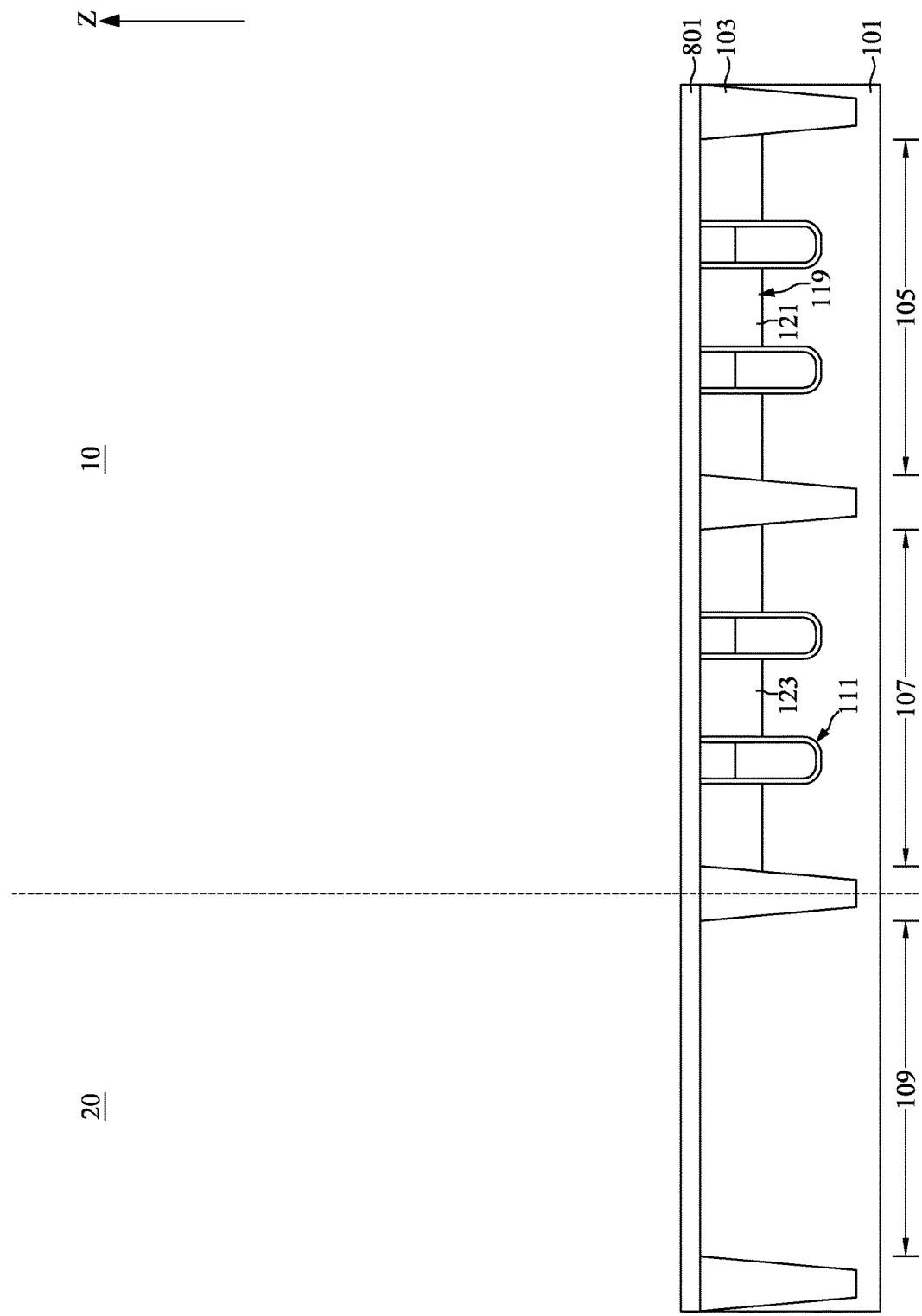
Figure 8:
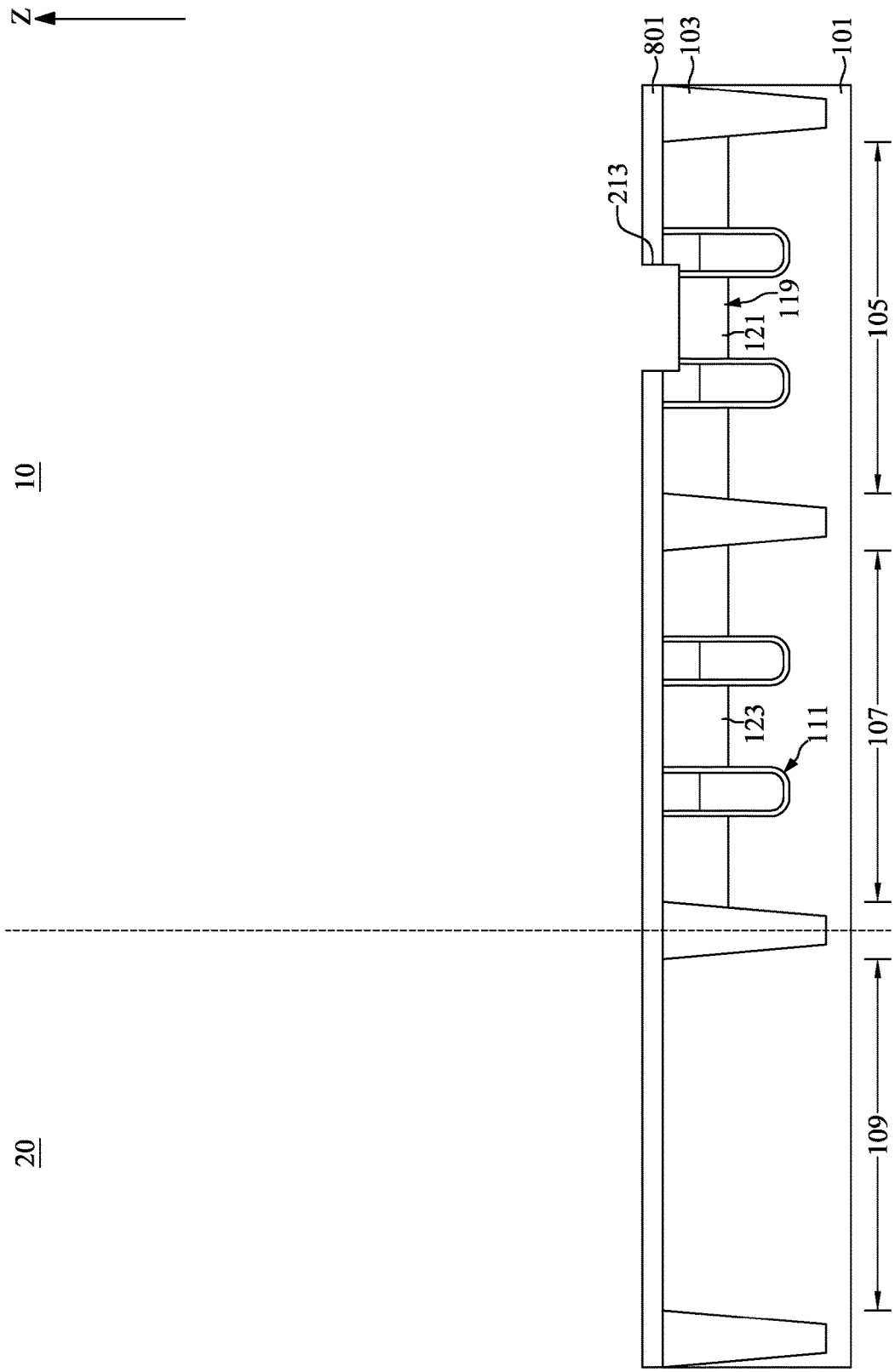

With reference to FIGS. 5 and 7 to 9, at step S13, in the embodiment depicted, a first bit line contact 201 may be formed at the central array area 10 of the substrate 101. With reference to FIG. 7, a buffer layer 801 may be formed on the substrate 101 by a deposition process. With reference to FIG. 8, a photolithography process may be performed to define a position of the first bit line contact 201 on the buffer layer 801 and at the first active region 105. After the photolithography process, an etch process, such as an anisotropic dry etch process, may be performed to form a first bit line contact opening 213 penetrating through the buffer layer 801 and an upper portion of the substrate 101.

Figure 9:
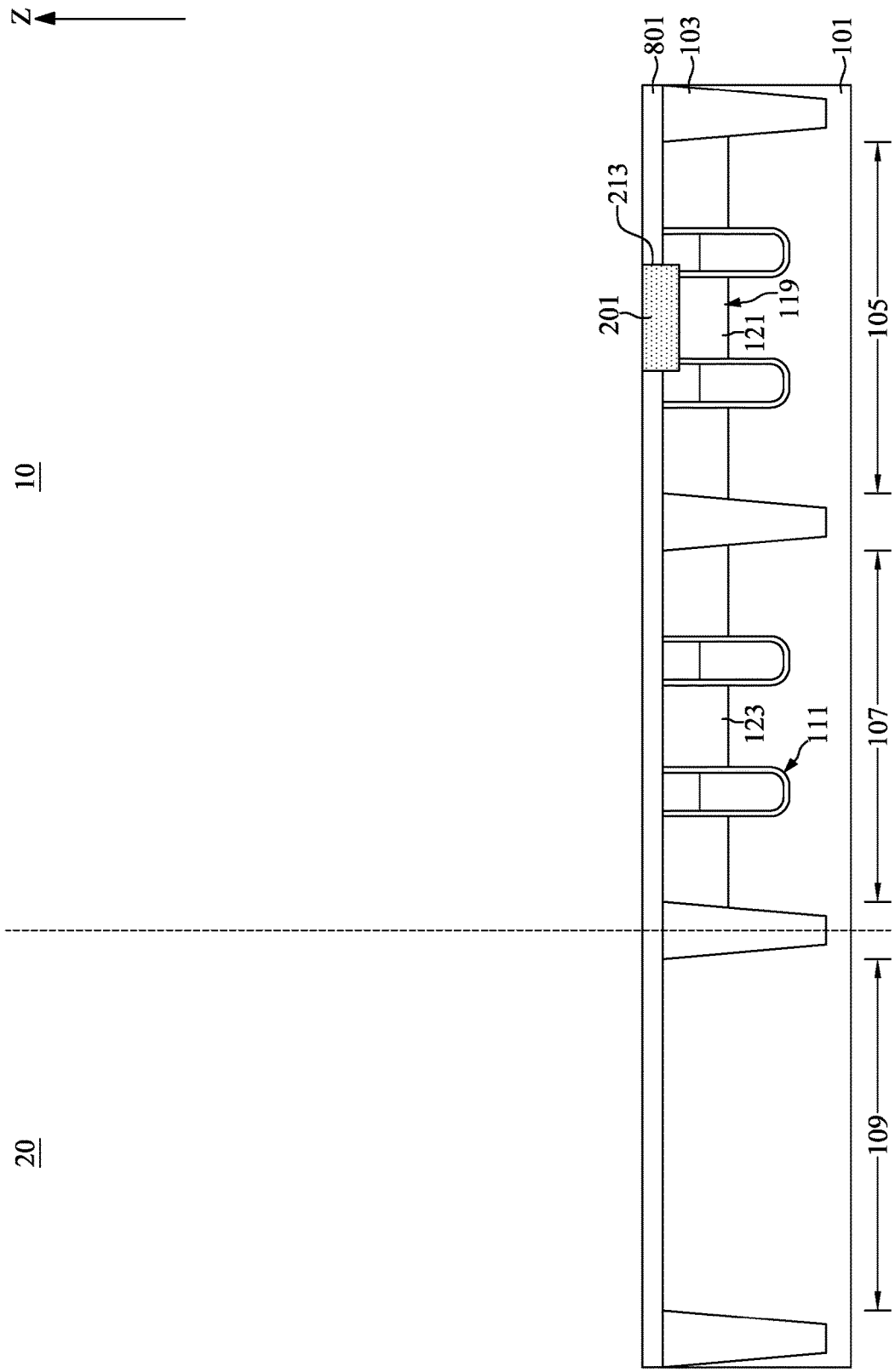

With reference to FIG. 9, a conductive material such as doped polysilicon, a metal, or a metal silicide may be deposited into the first bit line contact opening 213 by a deposition process. After the deposition process, a planarization process, such as chemical mechanical polishing, may be performed to remove excess material, provide a substantially flat surface for subsequent processing steps, and conformally form the first bit line contact 201. It should be noted that the first bit line contact 201 may completely fill the first bit line contact opening 213.

Figure 10:
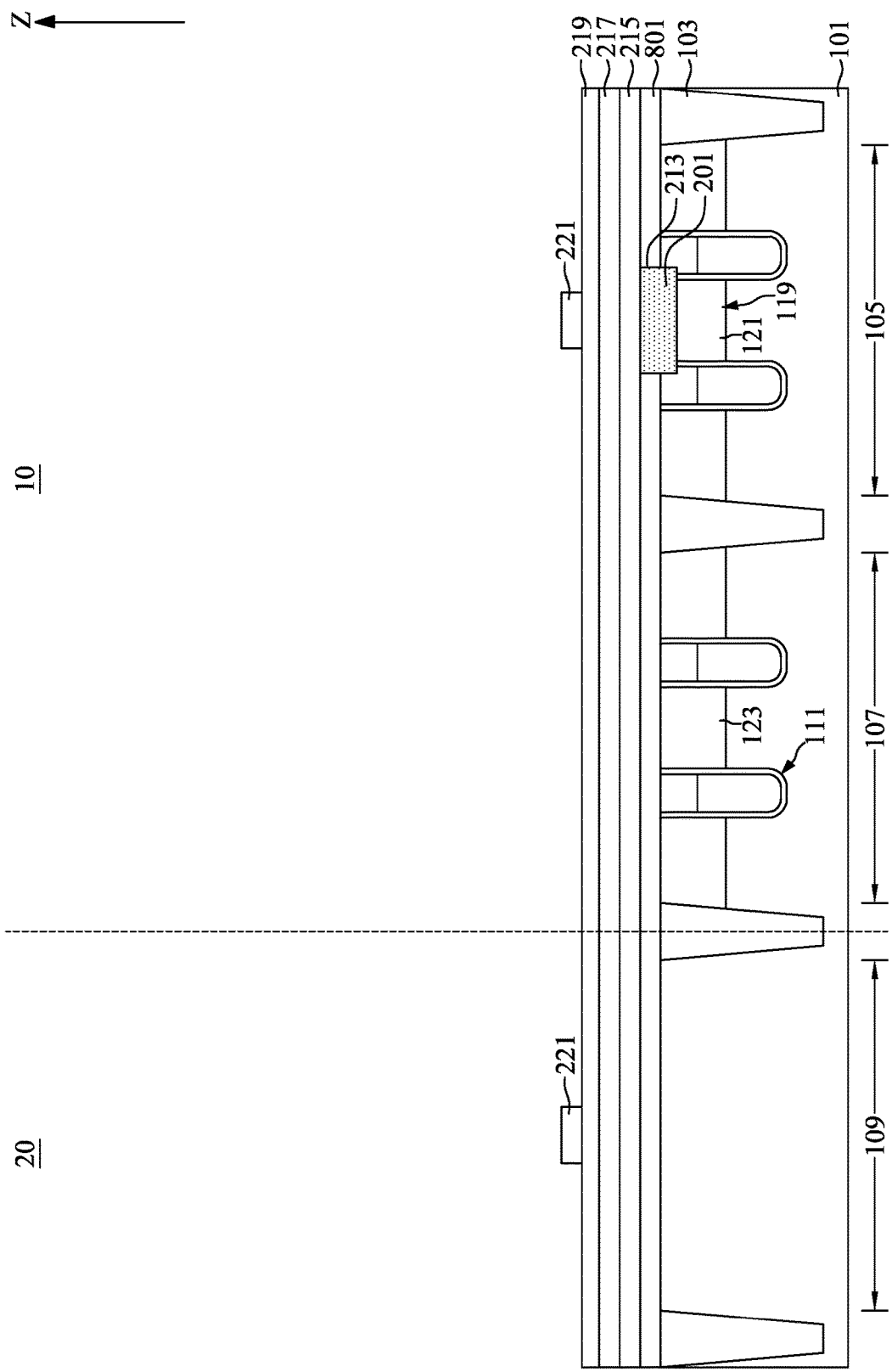

With reference to FIGS. 5 and 10 to 12, at step S15, in the embodiment depicted, a first bit line 203 and a first bit line capping layer 209 may be formed above the first bit line contact 201; concurrently, a first dummy bit line 301 and a first dummy capping layer 307 may be formed at the marginal array area 20. With reference to FIG. 10, a series of deposition processes may be performed to deposit a bottom conductive layer 215, a top conductive layer 217, a capping layer 219, a mask layer 221 on the buffer layer 801. The bottom conductive layer 215 may be formed of, for example, doped polysilicon. The top conductive layer 217 may be formed of, for example, copper, nickel, cobalt, aluminum, or tungsten. The capping layer 219 may be formed of, for example, silicon oxide or silicon nitride. The mask layer 221 may be a photoresist layer. A photolithography process may be performed to define a position of the first bit line 203 at the first active region 105 and a position of the first dummy bit line 301 at the dummy region 109 by patterning the mask layer 221.

Figure 11:
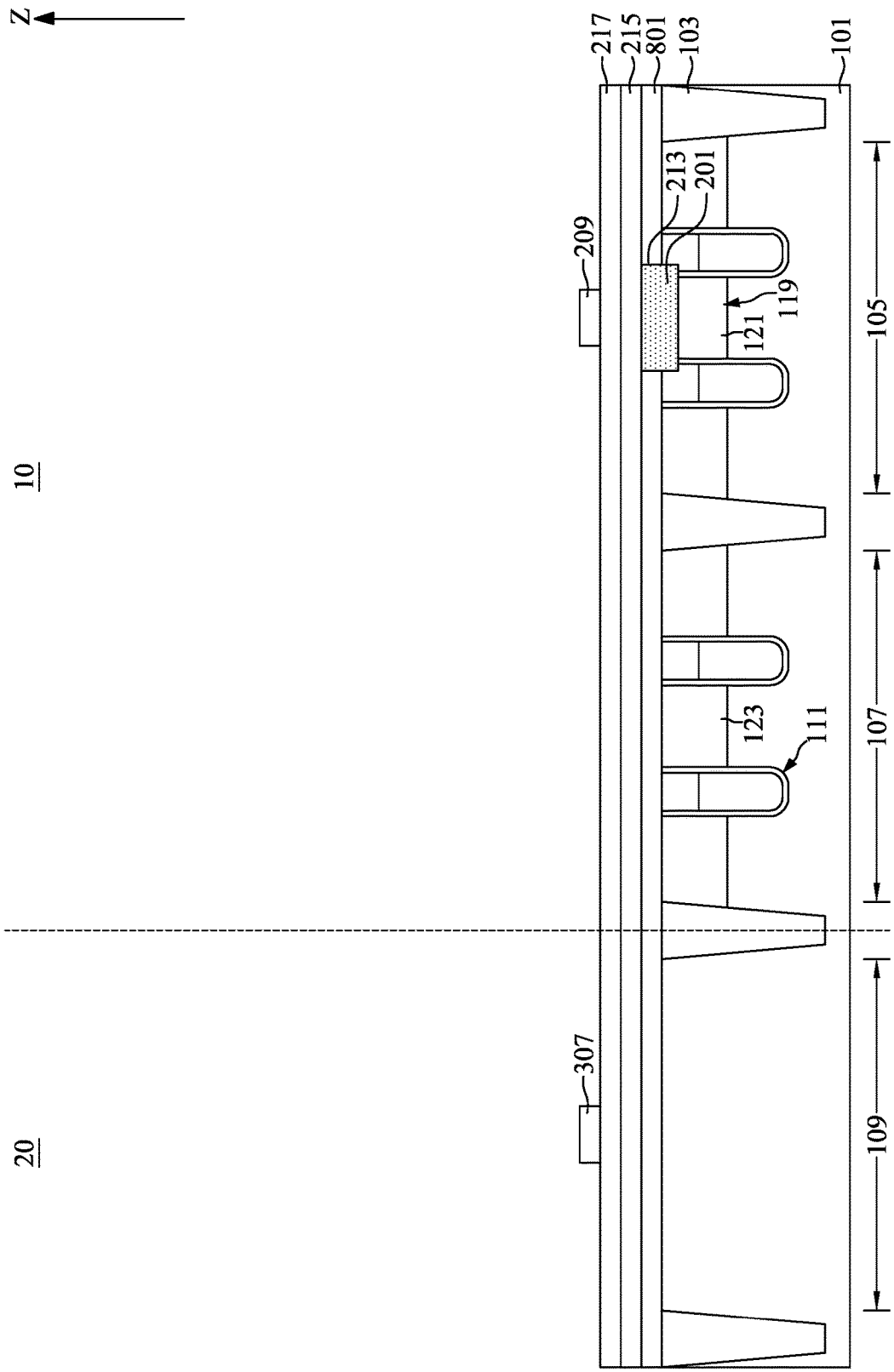
Figure 12:
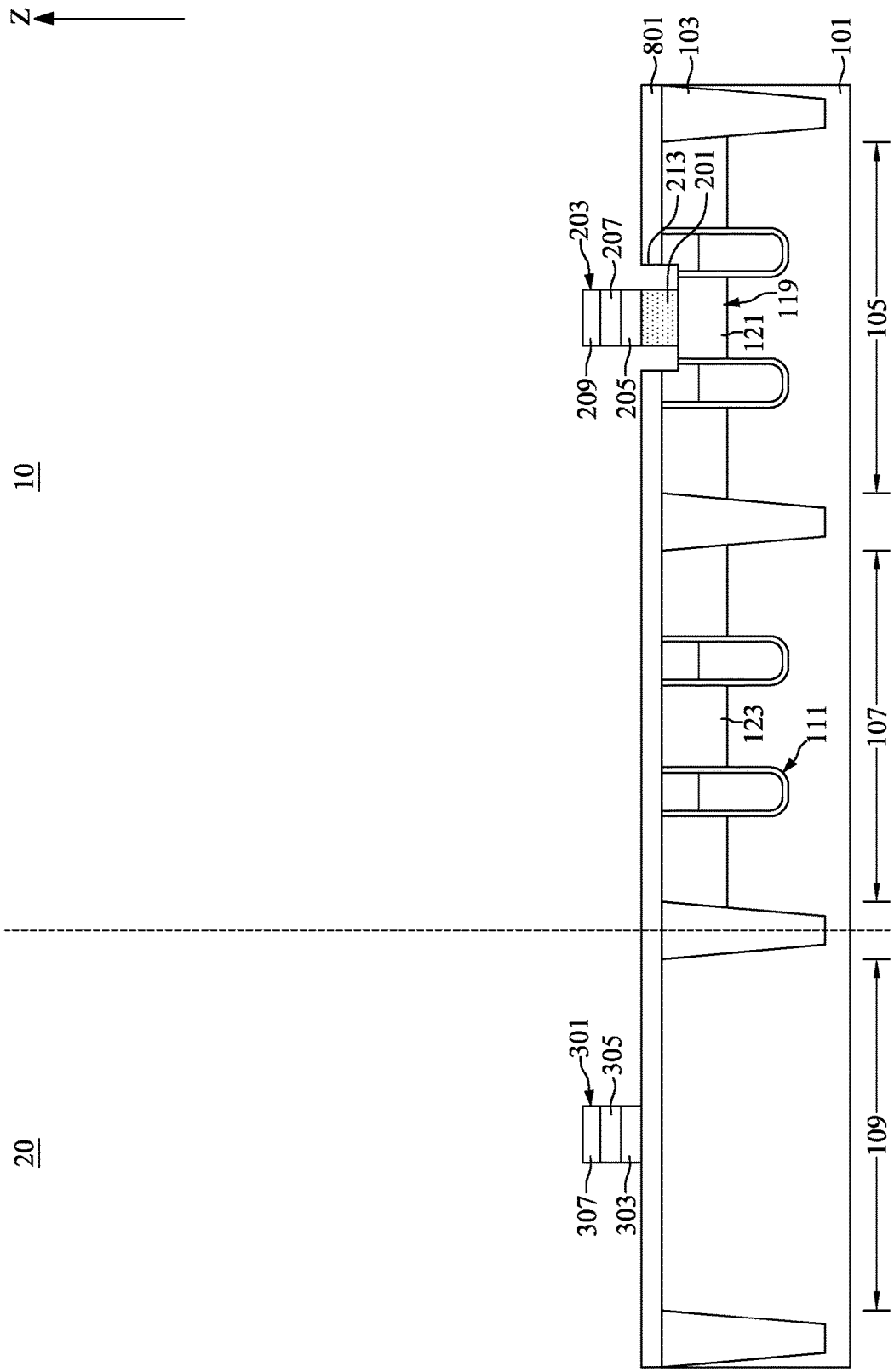

With reference to FIG. 11, after the photolithography process, a first etch process, such as an anisotropic dry etch process, may be performed with the mask layer 221 serving as a mask to turn the capping layer 219 into the first bit line capping layer 209 and the first dummy capping layer 307. With reference to FIG. 12, a second etch process, such as an anisotropic dry etch process, may be performed with the first bit line capping layer 209 and the first dummy capping layer 307 serving as masks. During the etch process, most of the top conductive layer 217 and most of the bottom conductive layer 215 may be removed, and only portions of the top conductive layer 217 and the bottom conductive layer 215 underneath the first bit line capping layer 209 and the first dummy capping layer 307 may be retained. The retained portions of the top conductive layer 217 may be respectively turned into the first bit line top conductive layer 207 and the first dummy top conductive layer 305. The retained portions of the bottom conductive layer 215 may be respectively turned into the first bit line bottom conductive layer 205 and the first dummy bottom conductive layer 303. The first bit line bottom conductive layer 205 and the first bit line top conductive layer 207 together form the first bit line 203. The first dummy bottom conductive layer 303 and the first dummy top conductive layer 305 together form the first dummy bit line 301. In addition, portions of the first bit line contact 201 exposed during the second etch process may be removed; in other words, a width of the first bit line contact 201 may be reduced. Hence, the first bit line contact 201 may be respectively correspondingly distanced from sidewalls of the first bit line contact opening 213.

Figure 13:
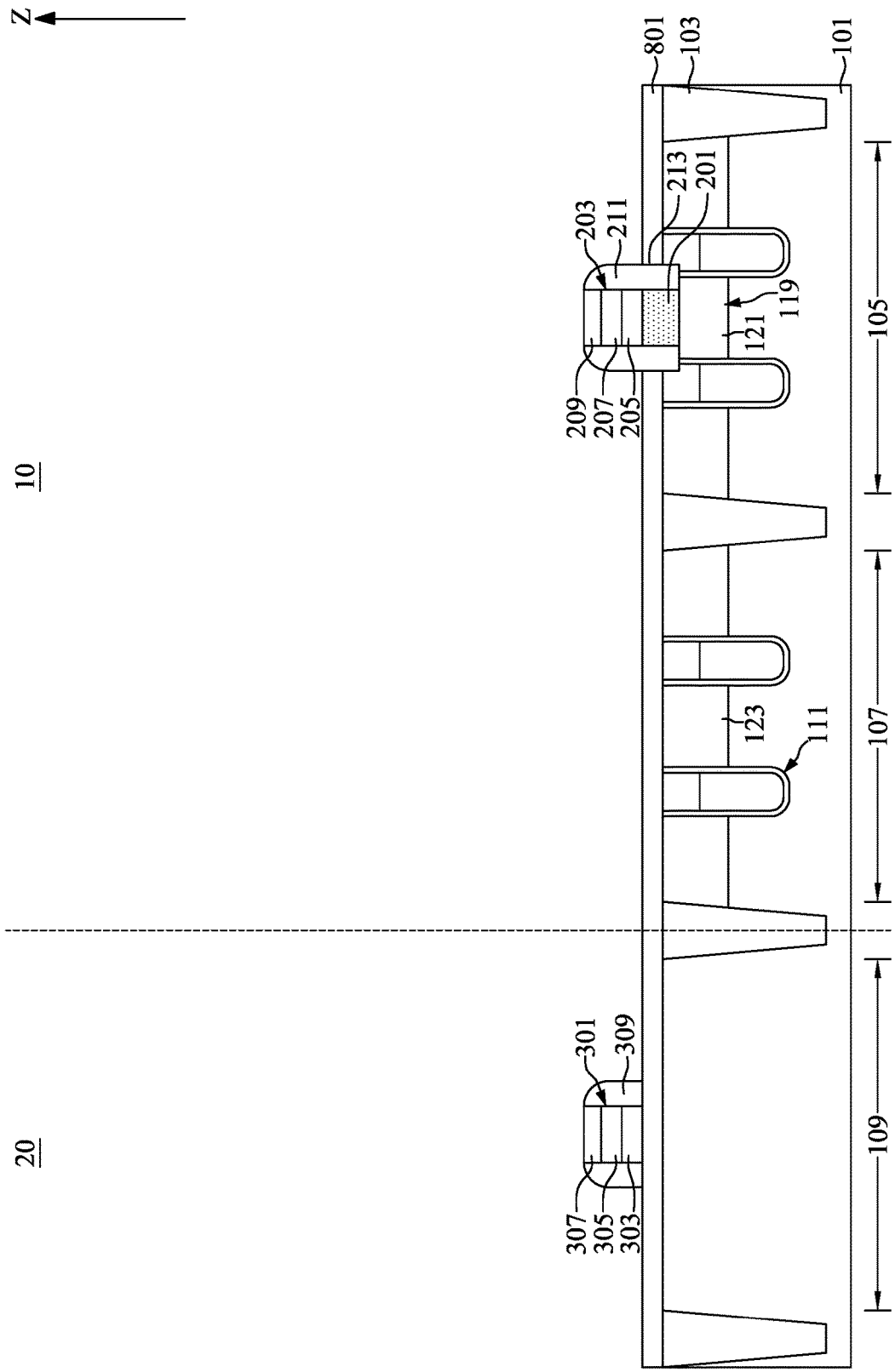

With reference to FIGS. 5 and 13, at step S17, in the embodiment depicted, first bit line spacers 211 may be formed at the central array area 10 and first dummy bit line spacers 309 may be formed at the marginal array area 20. A spacer layer may be deposited over the buffer layer 801 by a deposition process to cover the first dummy capping layer 307, the first dummy bit line 301, the first bit line capping layer 209 and the first bit line 203 and fill the first bit line contact opening 213. After the deposition process, an etch process, such as an anisotropic dry etch process, may be performed until top surfaces of the first bit line capping layer 209 and the first dummy capping layer 307 are exposed and concurrently form the first bit line spacers 211 and the first dummy bit line spacers 309.

Figure 14:
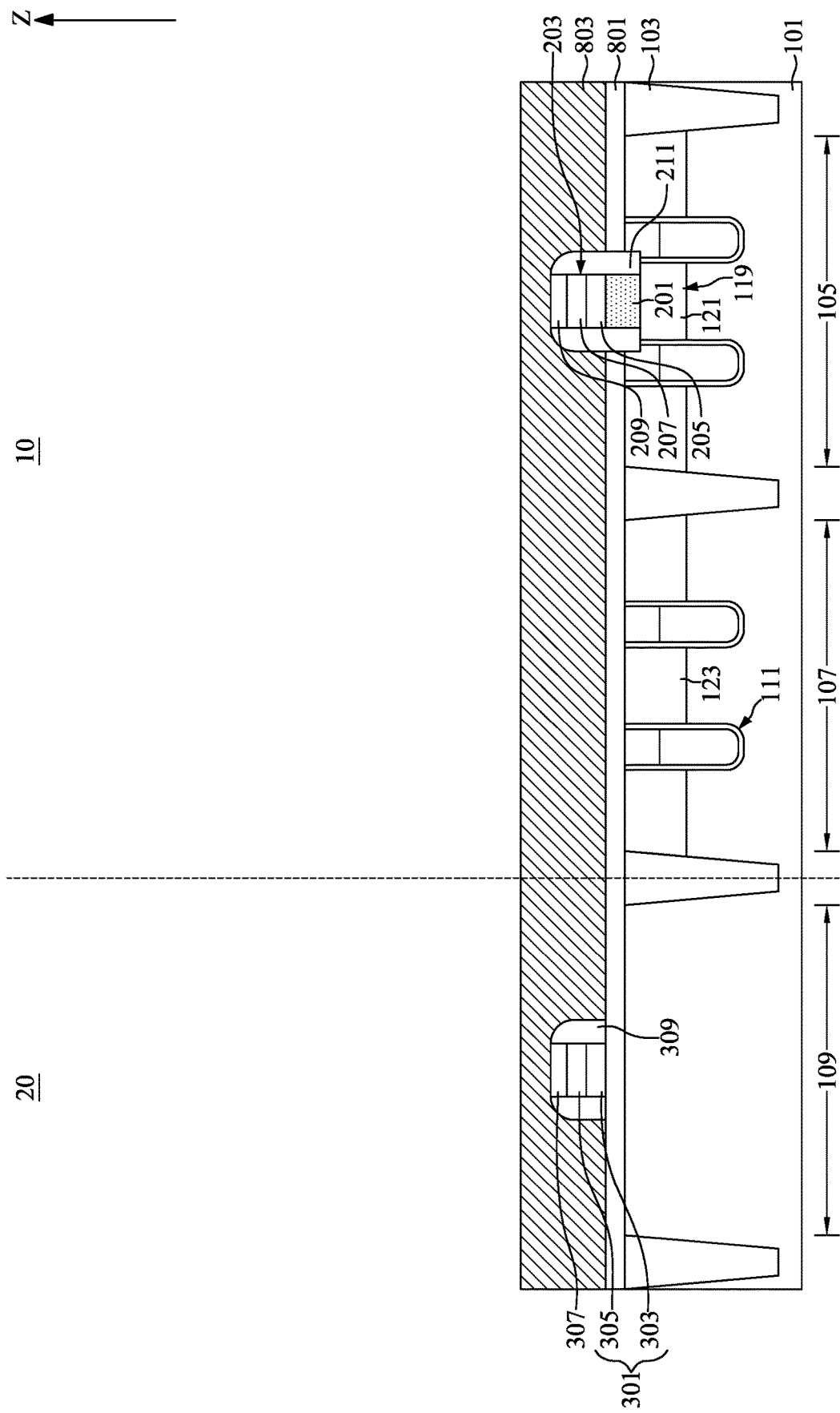

With reference to FIGS. 5 and 14 to 22, at step S19, in the embodiment depicted, a second bit line 403 may be formed higher than and offset from the first bit line 203 and a second dummy bit line 501 may be formed at the marginal array area 20. With reference to FIG. 14, a first insulating layer 803 may be formed on the buffer layer 801 and over the first dummy capping layer 307, the first dummy bit line spacers 309, the first bit line spacers 211, and the first bit line capping layer 209. A planarization process, such as chemical mechanical polishing, may be performed to provide a substantially flat surface for subsequent processing steps.

Figure 15:
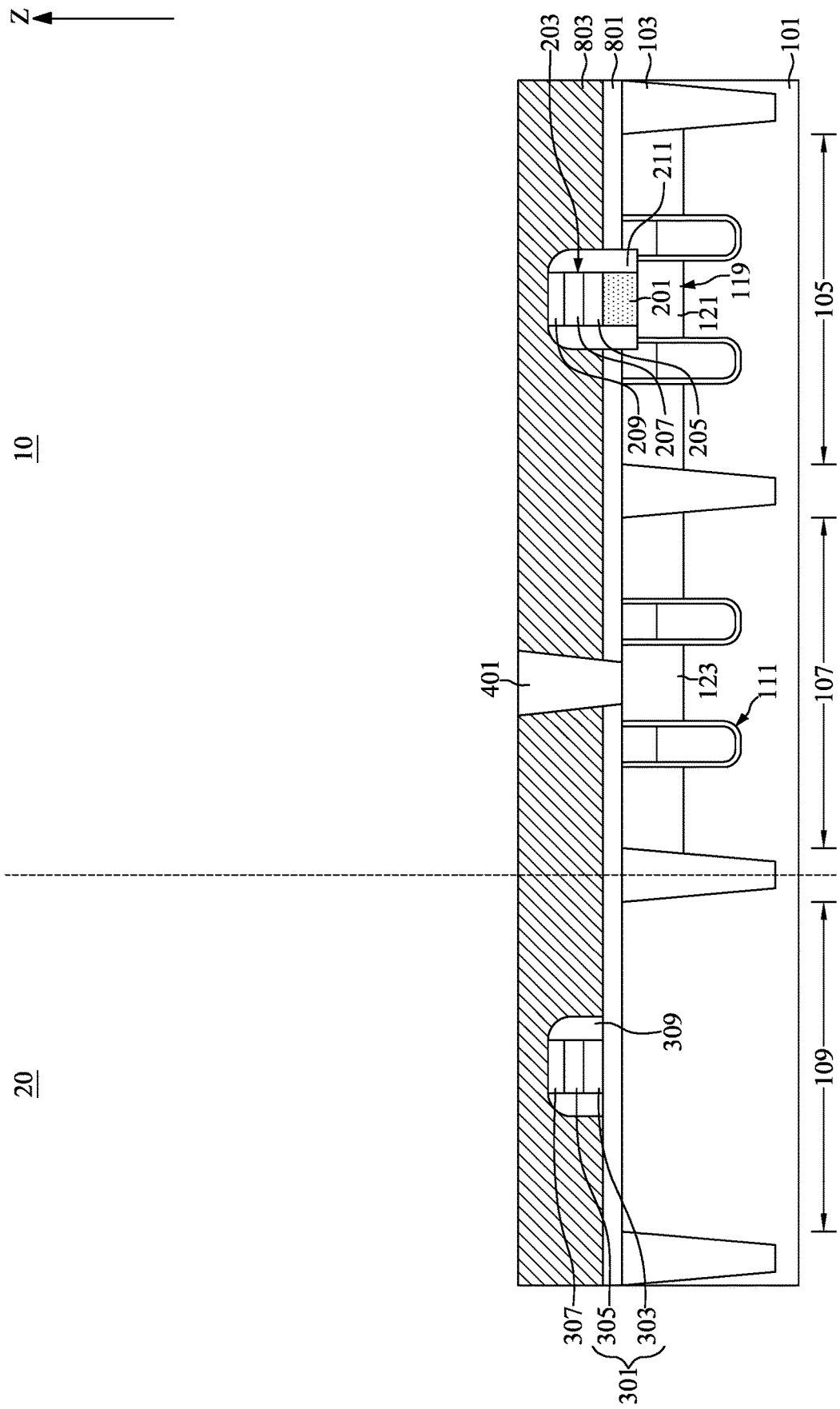

With reference to FIG. 15, a second bit line contact 401 may be formed penetrating through the first insulating layer 803 and the buffer layer 801 and located at the second active region 107. A photolithography process may be performed to define a position of the second bit line contact 401. After the photolithography process, an etch process, such as an anisotropic dry etch process, may be performed to form a second bit line contact opening penetrating through the first insulating layer 803 and buffer layer 801. A top surface of the second common doped region 123 may be exposed through the second bit line contact opening. A conductive material, for example, doped polysilicon, a metal, or a metal silicide may be deposited into the second bit line contact opening by a metallization process. After the metallization process, a planarization process, such as chemical mechanical polishing, may be performed to remove excess material, provide a substantially flat surface for subsequent processing steps, and conformally form the second bit line contact 401.

Figure 16:
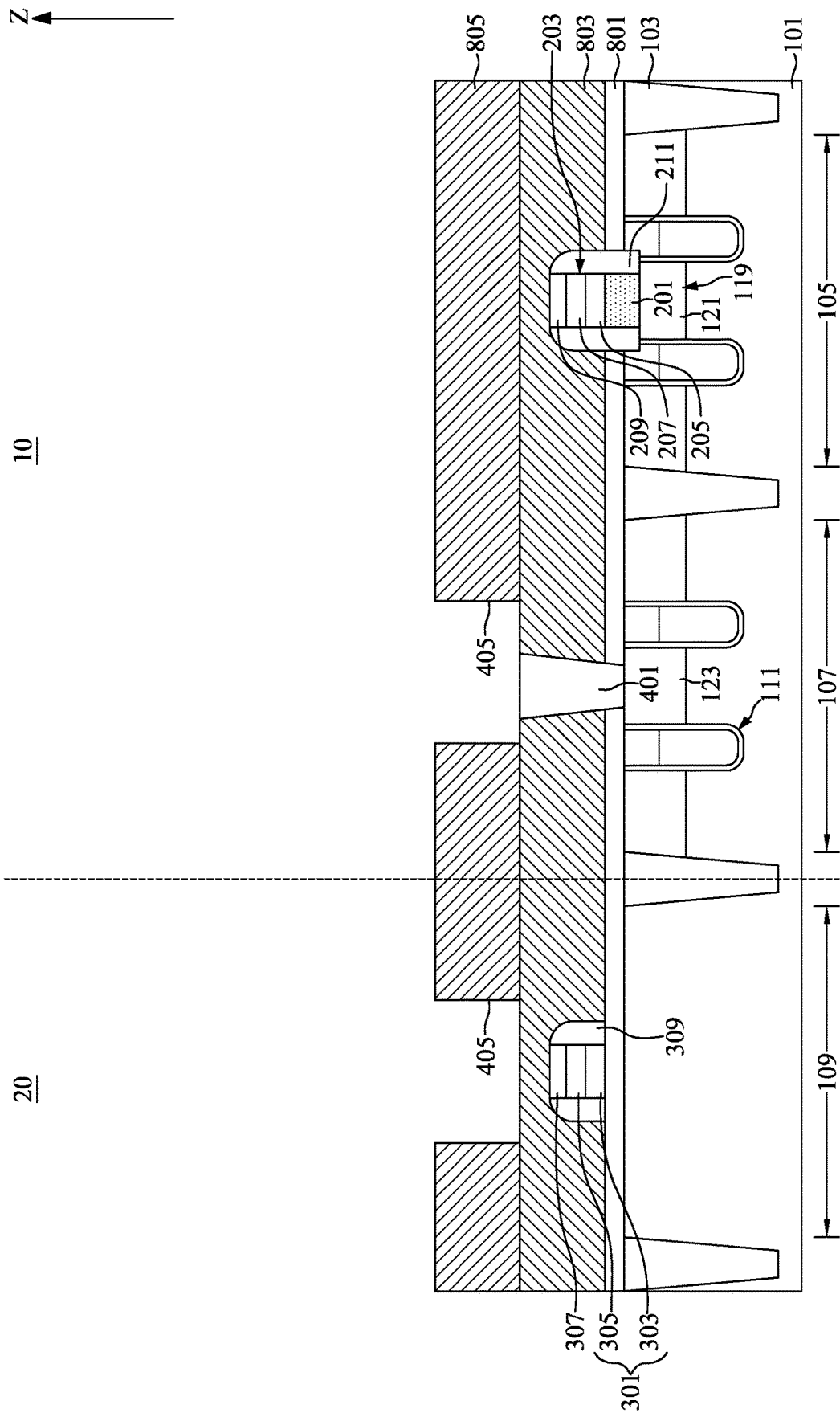

With reference to FIG. 16, a second insulating layer 805 may be formed on the first insulating layer 803 by a deposition process. A photolithography process may be performed to define positions of the second bit line 403 and the second dummy bit line 501 by patterning the second insulating layer 805. After the photolithography process, an etch process, such as an anisotropic dry etch process, may be performed to form a plurality of second bit line trenches 405 in the second insulating layer 805 and respectively at the second active region 107 and the dummy region 109. The second bit line trench 405 located at the second active region 107 may expose a top surface of the second bit line contact 401. The second bit line trench 405 located at the dummy region 109 may be directly above the first dummy capping layer 307.

Figure 17:
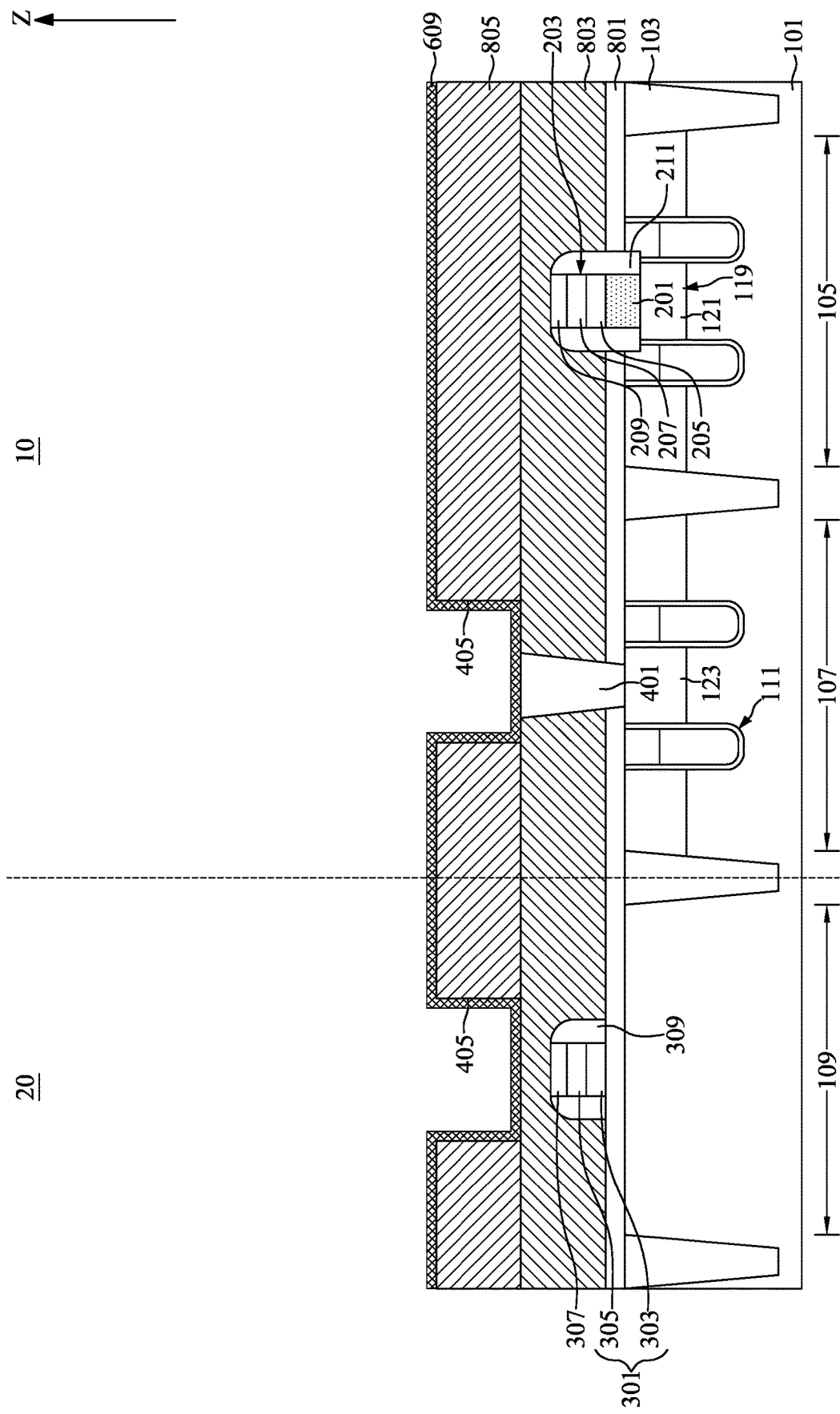
Figure 18:
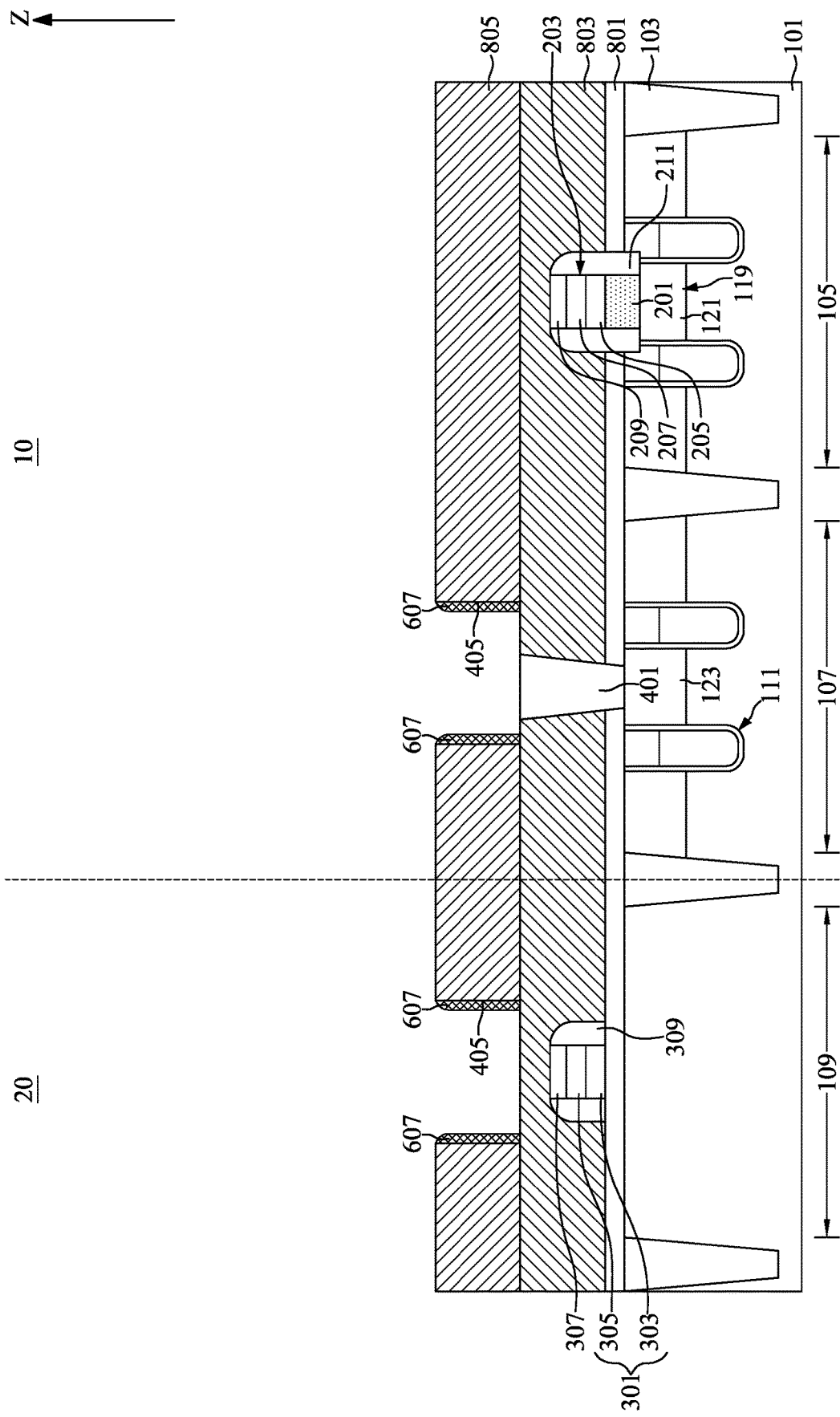

With reference to FIG. 17, a sacrificial spacer layer 609 may be formed in the plurality of second bit line trenches 405 and over a top surface of the second insulating layer 805 by a deposition process. With reference to FIG. 18, an etch process, such as an anisotropic dry etch process, may be performed to remove the sacrificial spacer layer 609 formed on the top surface of the second insulating layer 805 and bottoms of the plurality of second bit line trenches 405, and concurrently form the plurality of sacrificial spacers 607 attached to sidewalls of the plurality of second bit line trenches 405.

Figure 19:
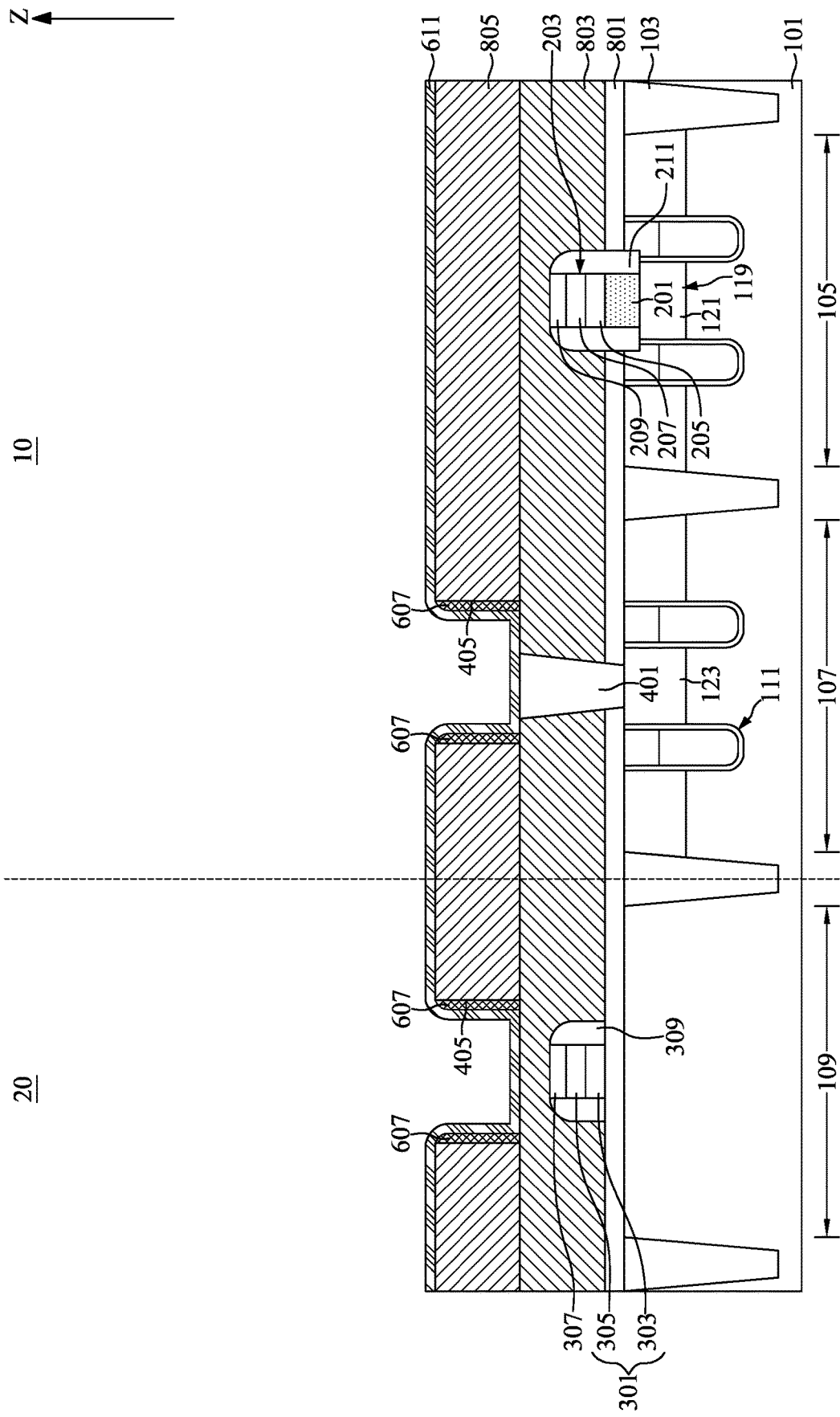
Figure 20:
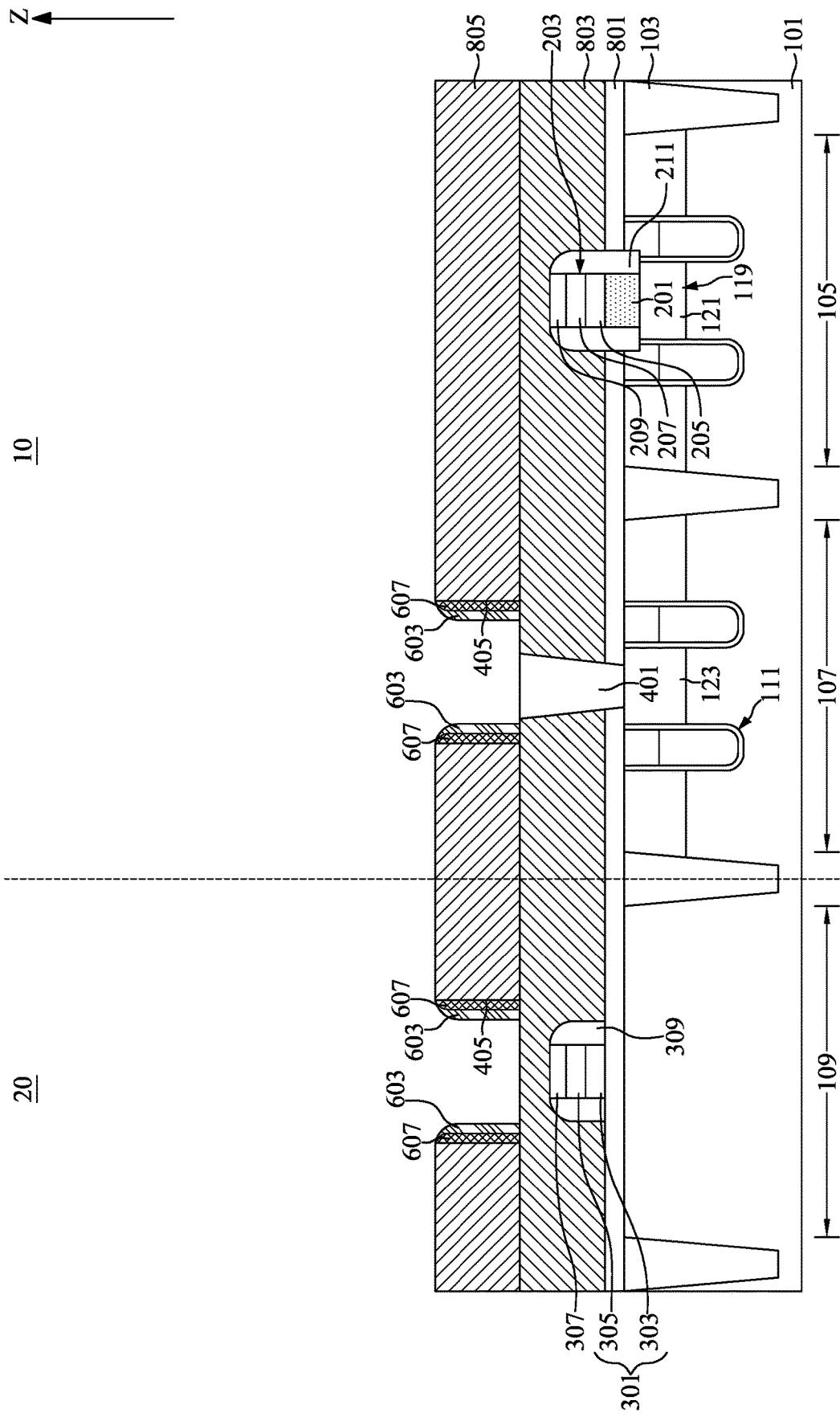

With reference to FIG. 19, a covering spacer layer 611 may be formed to cover the top surface of the second insulating layer 805, sidewalls of the plurality of sacrificial spacers 607, and the bottoms of the plurality of second bit line trenches 405 by a deposition process. With reference to FIG. 20, an etch process, such as an anisotropic dry etch process, may be performed to remove portions of the covering spacer layer 611 formed on the top surface of the second insulating layer 805 and bottoms of the plurality of second bit line trenches 405 and concurrently form the plurality of covering spacers 603 attached to the sidewalls of the plurality of sacrificial spacers 607. The plurality of sacrificial spacers 607 may be formed of, for example, a material having etching selectivity with respect to the second insulating layer 805 and the plurality of covering spacers 603. Specifically, in the embodiment depicted, the plurality of sacrificial spacers 607 may be formed of doped oxide such as borosilica glass, phosphosilica glass, borophosphosilica glass, fluoride silicate glass, carbon doped silicon oxide, or the like. The plurality of covering spacers 603 and the second insulating layer 805 may be formed of silicon nitride or undoped oxide. Alternatively, in another embodiment, the plurality of sacrificial spacers 607 may be formed of a thermal decomposable polymer or a thermal degradable polymer.

Figure 21:
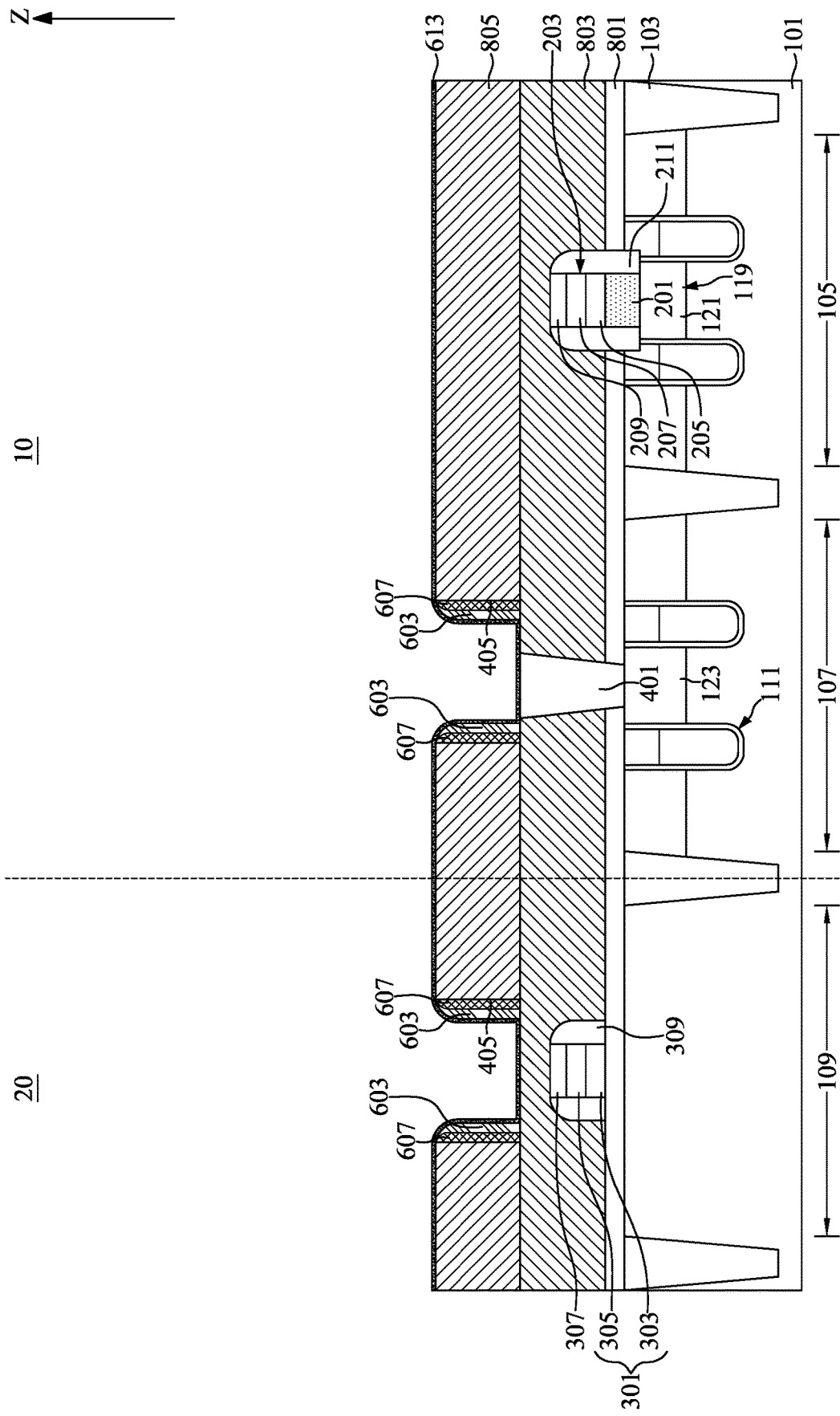
Figure 22:
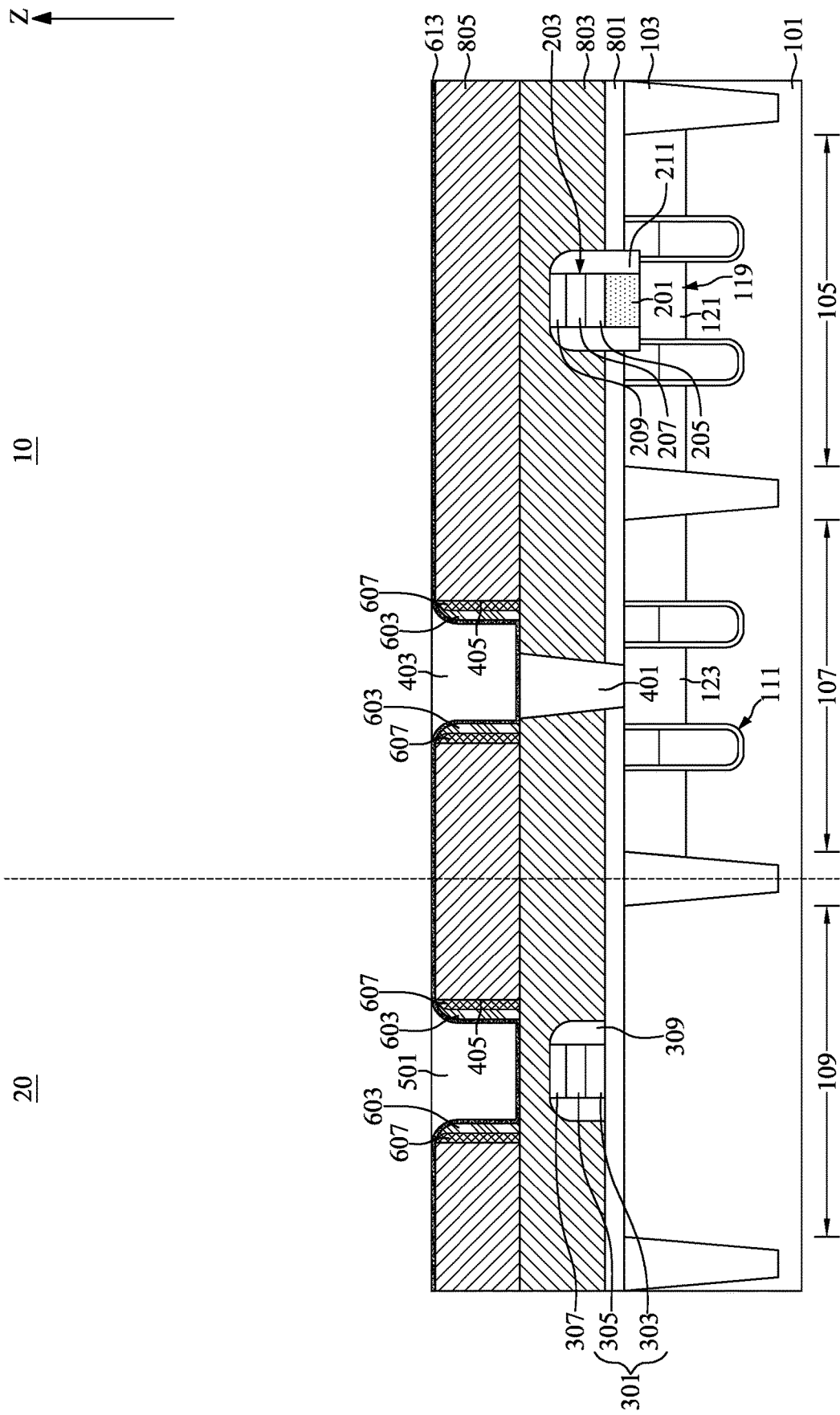

With reference to FIG. 21, a liner layer 613 may be formed to cover the top surface of the second insulating layer 805, sidewalls of the plurality of covering spacers 603, and the bottoms of the plurality of second bit line trenches 405 by a deposition process. The liner layer 613 may be formed of, for example, titanium, titanium nitride, titanium silicon nitride, tantalum, tantalum nitride, tantalum silicon nitride, and combination thereof. With reference to FIG. 22, a conductive material such as doped polysilicon, metal, metal nitride, or metal silicide may be deposited into the plurality of second bit line trenches 405 by a metallization process. After the metallization process, a planarization process, such as chemical mechanical polishing, may be performed to remove excess material, provide a substantially flat surface for subsequent processing steps, and conformally form the second bit line 403 and the second dummy bit line 501.

Figure 23:
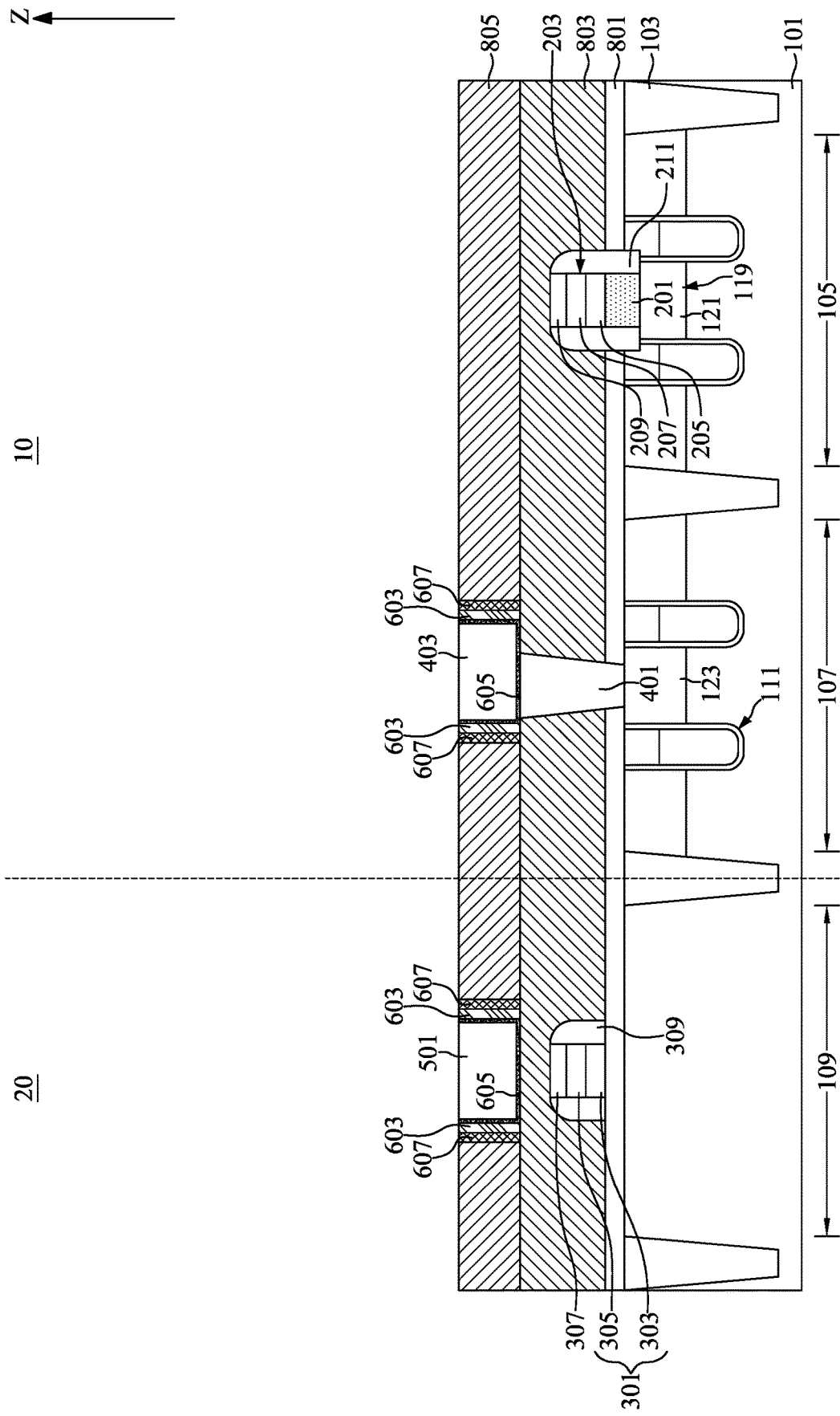
Figure 24:
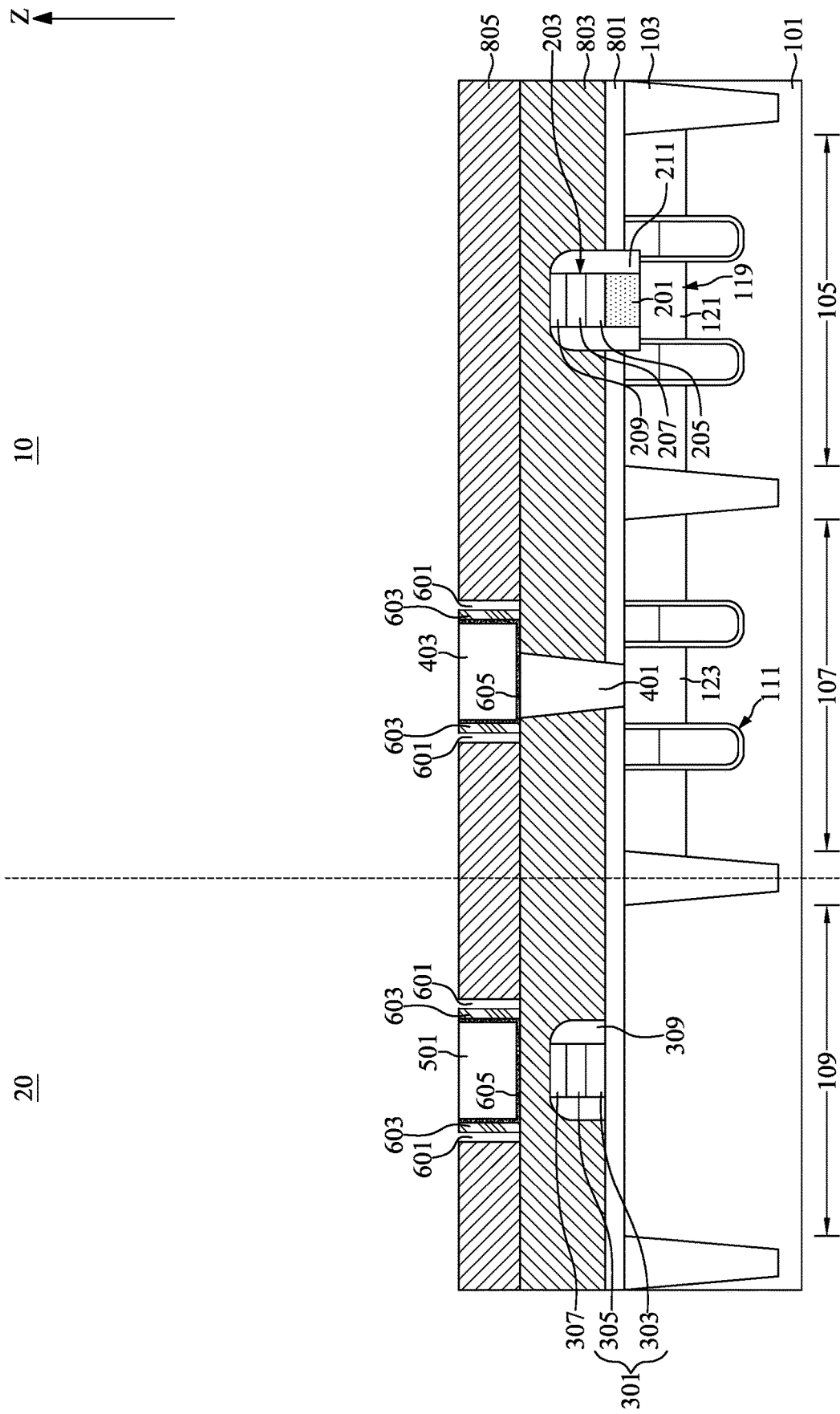

With reference to FIGS. 5, 23, and 24, at step S21, in the embodiment depicted, a plurality of air gaps 601 may be formed adjacent to the second bit line 403 and the second dummy bit line 501. With reference to FIG. 23, a planarization process, such as chemical mechanical polishing, may be performed to reduce a thickness of the second insulating layer 805 and remove portions of the liner layer 613, portions of the plurality of covering spacers 603, and portions of the plurality of sacrificial spacers 607. After the planarization process, the liner layer 613 may be turned into a plurality of liners 605 disposed adjacent to sidewalls and bottoms of the second bit line 403 and the second dummy bit line 501. Top surfaces of the plurality of sacrificial spacers 607 may be exposed after the planarization process.

With reference to FIG. 24, the plurality of sacrificial spacers 607 may be removed to thereby form the plurality of air gaps 601. Specifically, in the embodiment depicted, a vapor hydrogen fluoride may be introduced and may etch the plurality of sacrificial spacers 607. The vapor hydrogen fluoride has a higher etching rate on the plurality of sacrificial spacers 607 formed of doped oxide; therefore, the plurality of sacrificial spacers 607 may be removed and the plurality of covering spacers 603 formed of silicon nitride or undoped oxide may be retained. The plurality of covering spacers 603 may prevent the second dummy bit line 501 from flowing into the plurality of air gaps 601 during subsequent processing steps such as heat treatment. Alternatively, in another embodiment, a heat process may be applied to remove the plurality of sacrificial spacers 607 formed of thermal decomposable polymer or thermal degradable polymer. A temperature of the heat process may be between about 300° C. and about 450° C. Preferably, the temperature of the heat process may be between about 350° C. and about 420° C.

Figure 25:
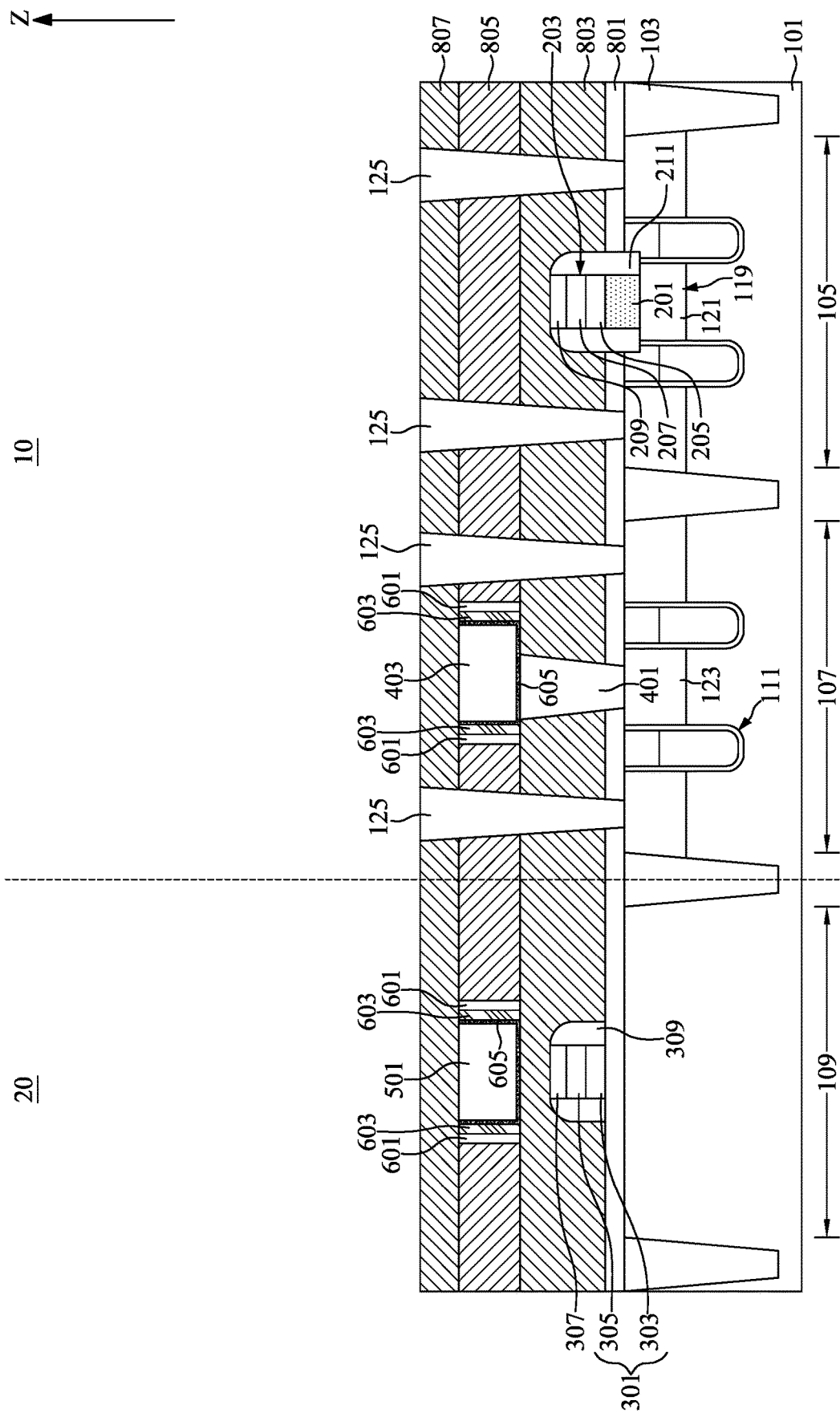

With reference to FIGS. 1, 5, and 25 to 28, at step S23, in the embodiment depicted, a plurality of capacitor structures 701 may be formed at the central array area 10. With reference to FIG. 25, a third insulating layer 807 may be formed on the second insulating layer 805 by a deposition process. It should be noted that the plurality of air gaps 601 may not be filled after the formation of the third insulating layer 807. A photolithography process may be performed to define positions of the plurality of capacitor plugs 125. After the photolithography process, an etch process, such as an anisotropic dry etch process, may be performed to form a plurality of capacitor plug openings penetrating through the third insulating layer 807, the second insulating layer 805, the first insulating layer 803, and the buffer layer 801. Some of the plurality of doped regions 119 may be exposed through the plurality of capacitor plug openings. A conductive material such as doped polysilicon, titanium, titanium nitride, tantalum, tantalum nitride, tungsten, copper, aluminum or aluminum alloy may be deposited into the plurality of capacitor plug openings. A planarization process, such as chemical mechanical polishing, may be performed to remove excess material, provide a substantially flat surface for subsequent processing steps, and conformally form the plurality of capacitor plugs 125 at the first active region 105 and the second active region 107.

Figure 26:
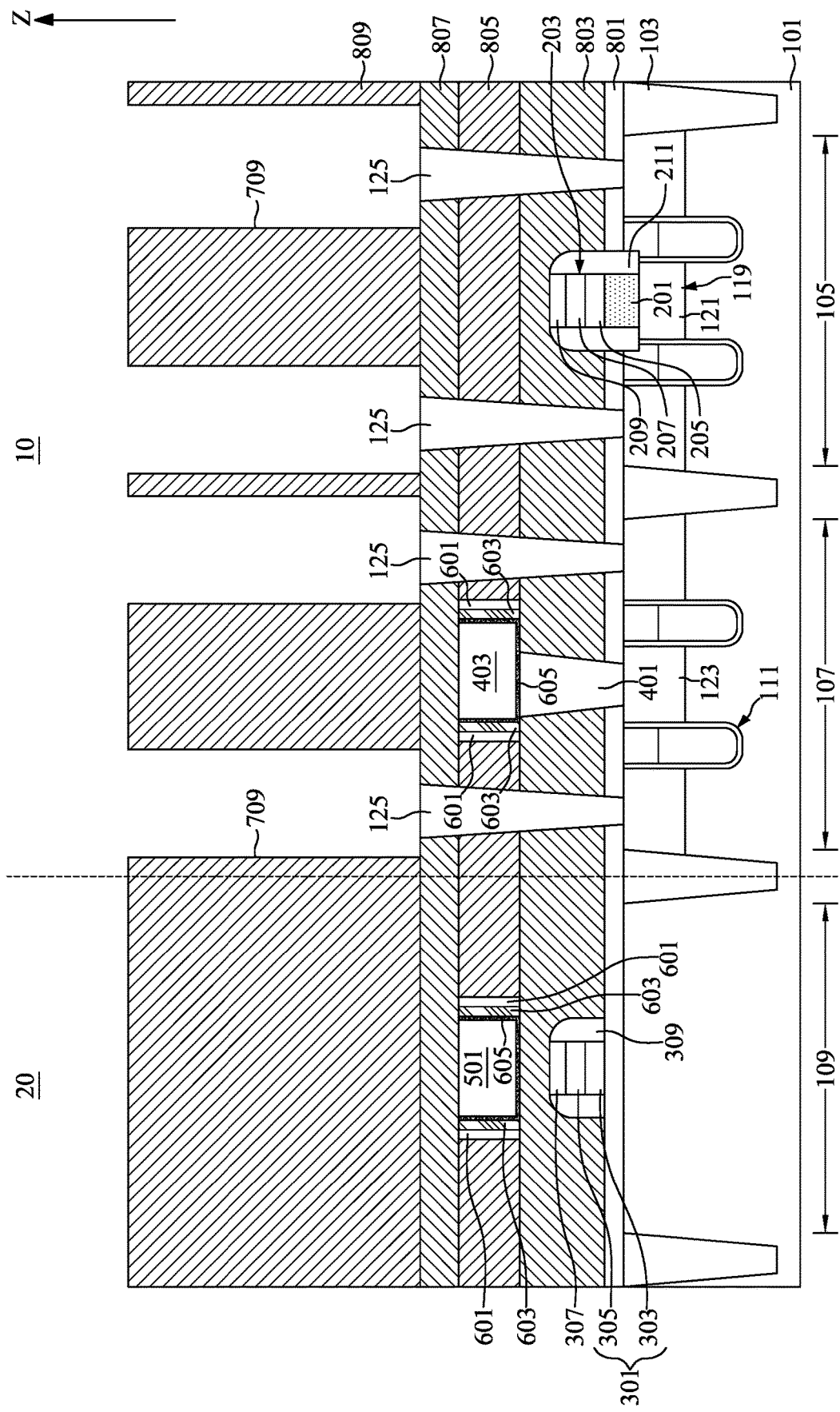

With reference to FIG. 26, a fourth insulating layer 809 may be formed on the third insulating layer 807 by a deposition process. A photolithography process may be performed to define positions of the plurality of capacitor structures 701. After the photolithography process, an etch process, such as an anisotropic dry etch process, may be performed to form a plurality of capacitor structure trenches 709 in the fourth insulating layer 809. Top surfaces of the plurality of capacitor plugs 125 may be exposed through the plurality of capacitor structure trenches 709.

Figure 27:
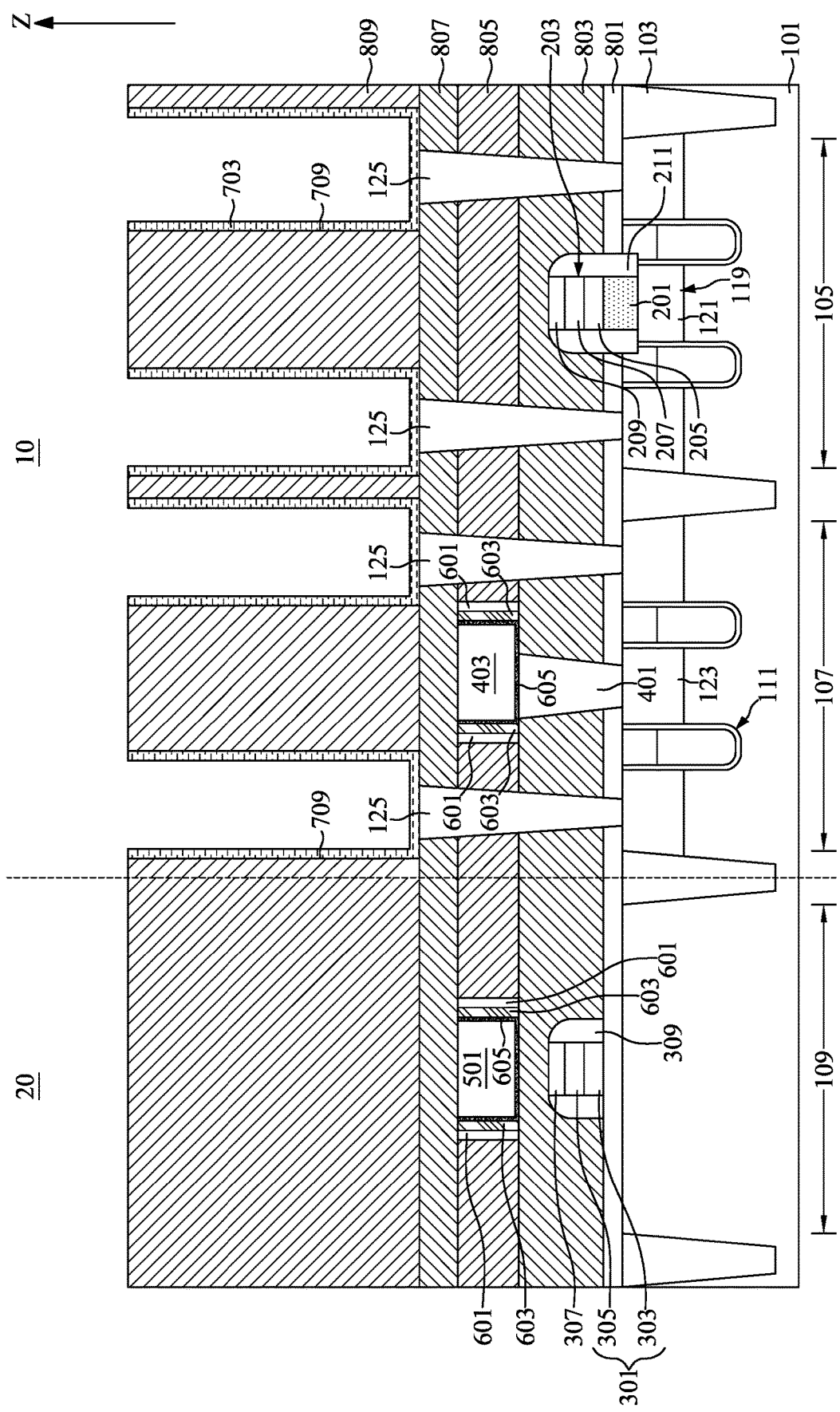
Figure 28:
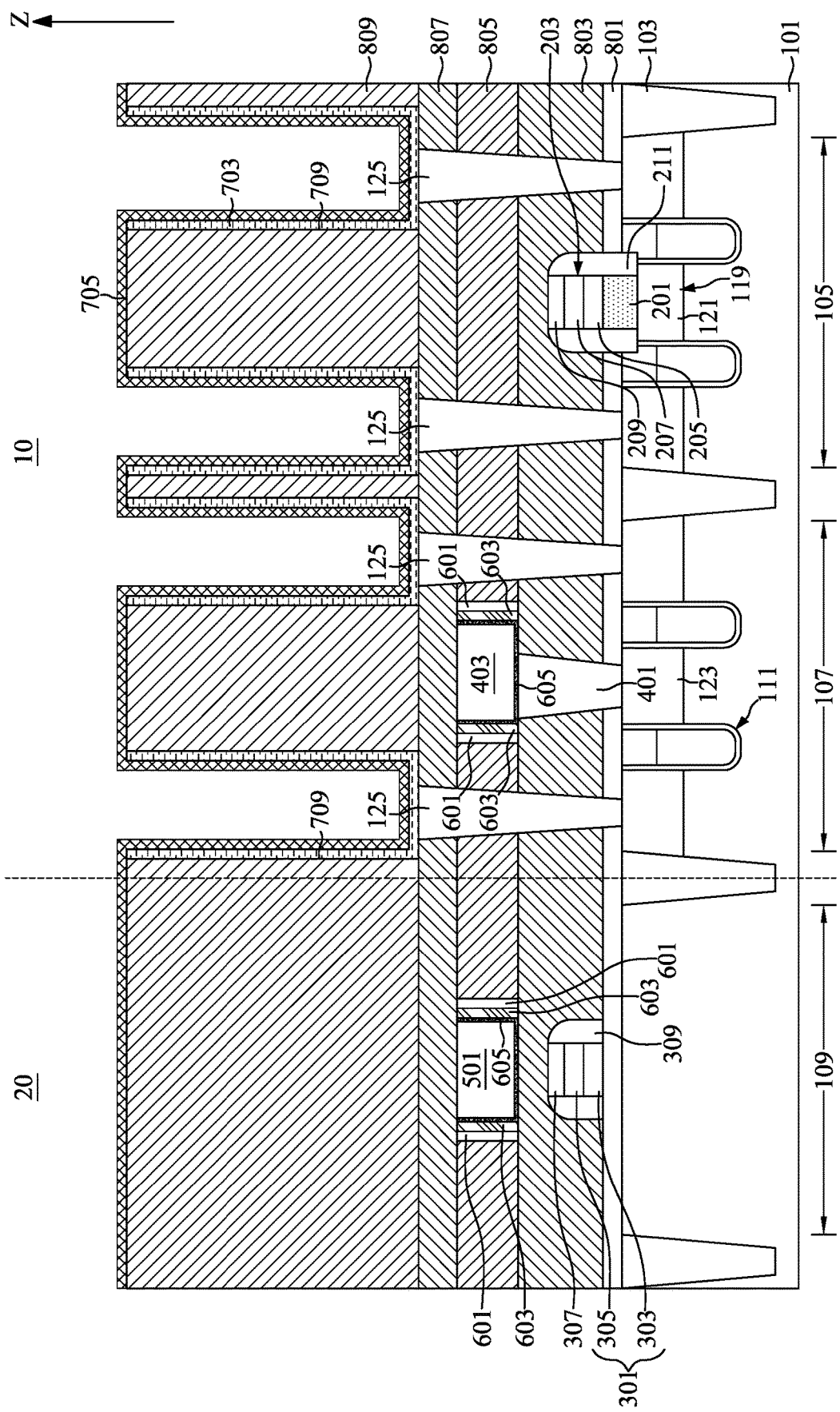

With reference to FIG. 27, a plurality of capacitor bottom electrodes 703 may be respectively correspondingly formed in the plurality of capacitor structure trenches 709. With reference to FIG. 28, a capacitor insulating layer 705 may be formed on the plurality of capacitor bottom electrodes 703 in the plurality of capacitor structure trenches 709. With reference back to FIG. 1, a capacitor top electrode 707 may be formed on the capacitor insulating layer 705 and may fill the plurality of capacitor structure trenches 709. The plurality of capacitor bottom electrodes 703, the capacitor insulating layer 705, and the capacitor top electrode 707 together form the plurality of capacitor structures 701 at the central array area 10.

FIGS. 29 to 41 illustrate, in schematic cross-sectional diagrams, part of a flow of fabricating a semiconductor device in accordance with another embodiment of the present disclosure.

Figure 29:
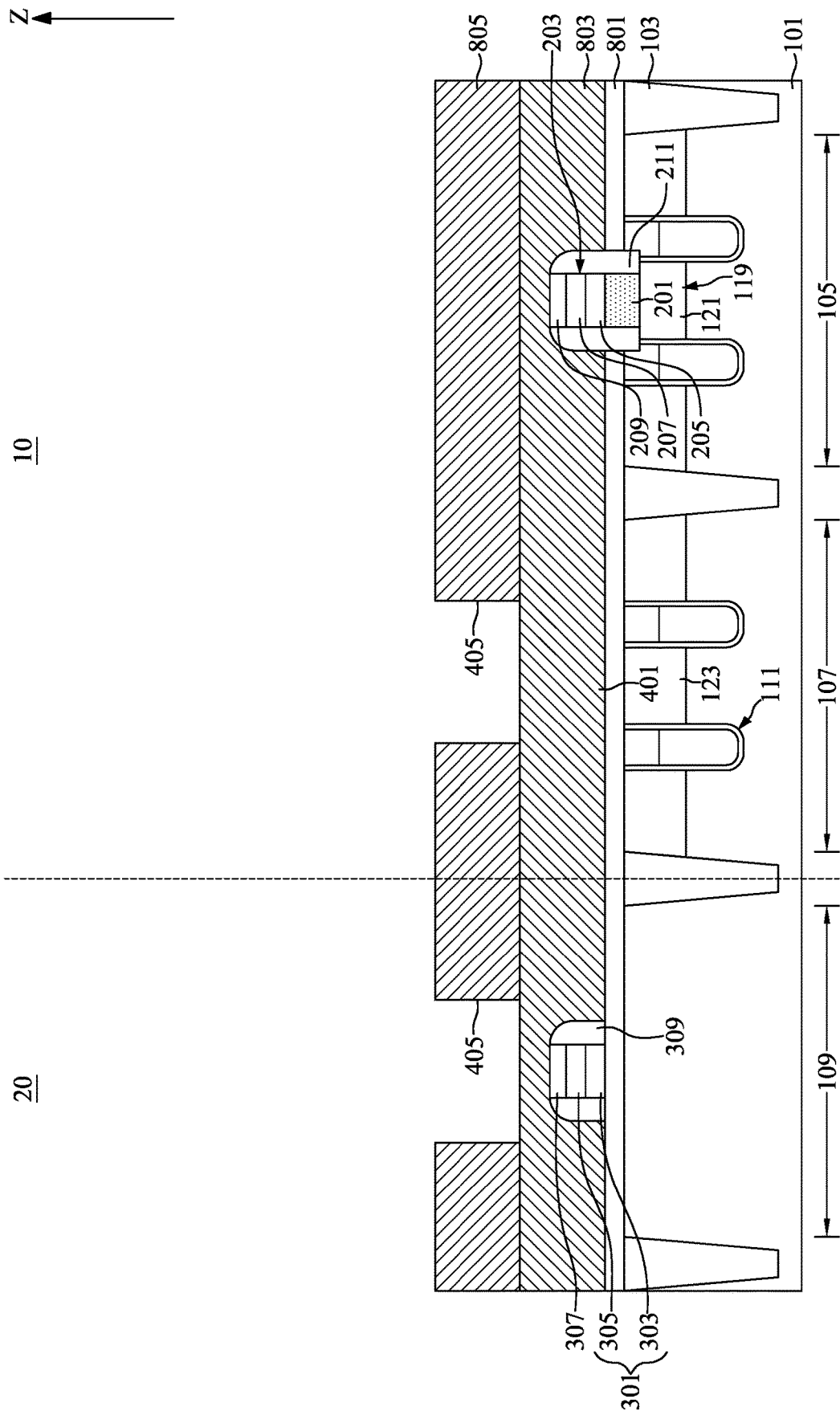
FIGS. 29 to 41 illustrate, in schematic cross-sectional diagrams, part of a flow of fabricating a semiconductor device in accordance with another embodiment of the present disclosure.
Figure 30:
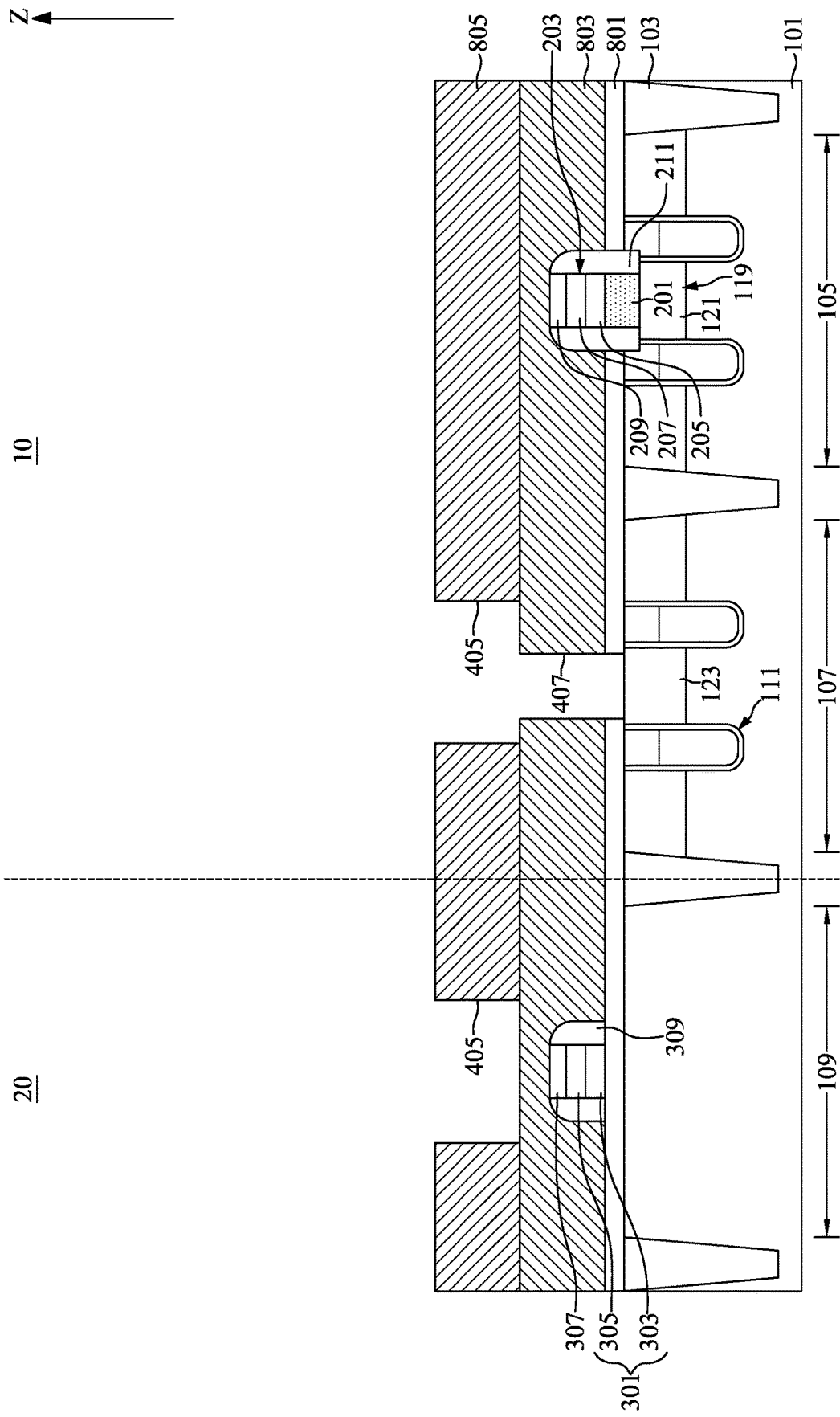

With reference to FIG. 29, the first insulating layer 803 may be formed on the buffer layer 801. The second insulating layer 805 may be formed on the first insulating layer 803. A first photolithography process may be performed to define the positions of the second bit line 403 and the second dummy bit line 501 on the second insulating layer 805. After the first photolithography process, a first etch process, such as an anisotropic dry etch process, may be performed to form the plurality of second bit line trenches 405 in the second insulating layer 805. With reference to FIG. 30, a second photolithography process may be performed to define the positions of the second bit line contact 401 on the first insulating layer 803. After the second photolithography process, a second etch process, such as an anisotropic dry etch process, may be performed to form a second bit line contact opening 407 penetrating through the first insulating layer 803 and the buffer layer 801.

Figure 31:
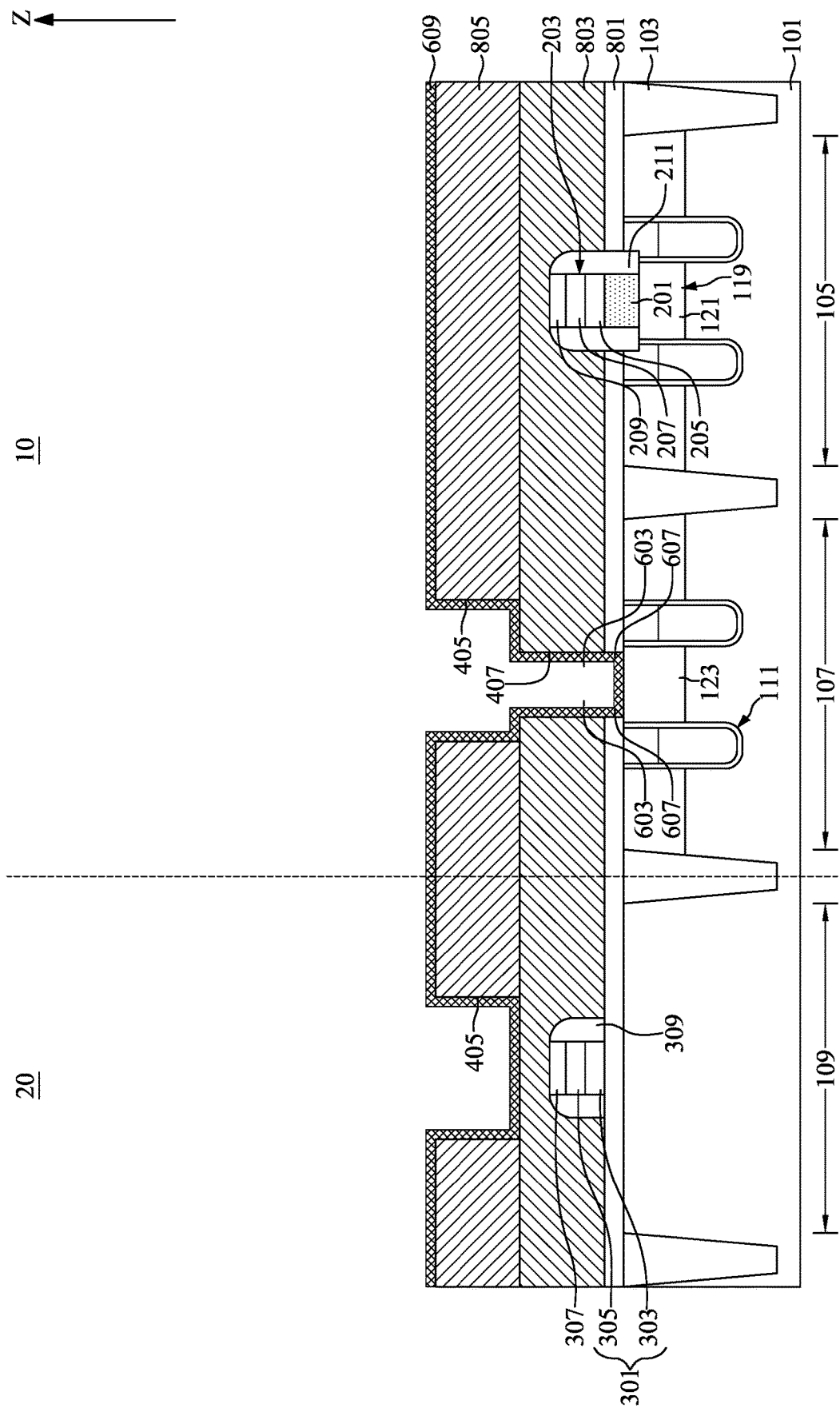
Figure 32:
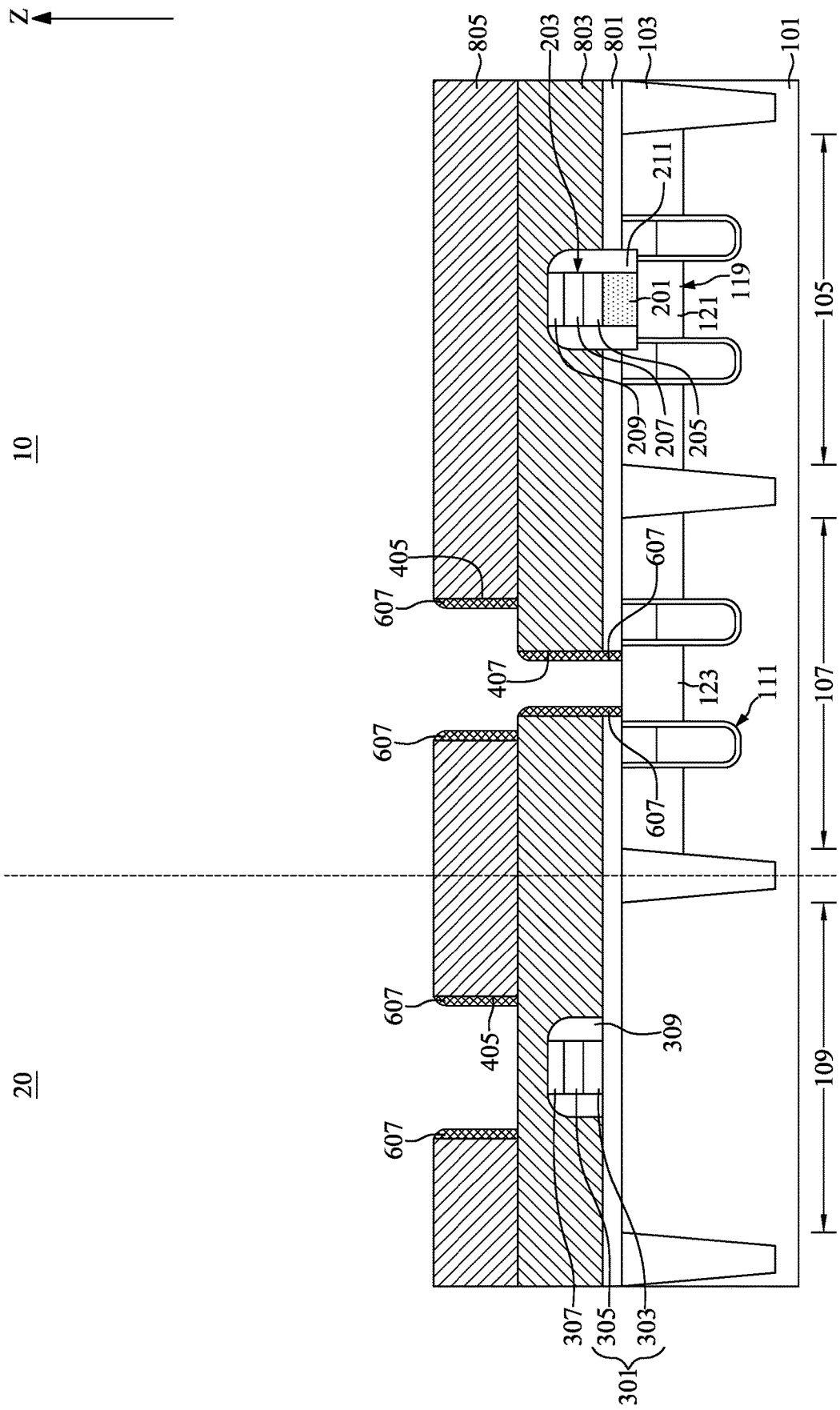

With reference to FIG. 31, the sacrificial spacer layer 609 may be formed on the top surface of the first insulating layer 803 and in the plurality of second bit line trenches 405 and the second bit line contact opening 407. With reference to FIG. 32, an etch process, such as an anisotropic dry etch process, may be performed to remove the sacrificial spacer layer 609 formed on the top surface of the second insulating layer 805, the bottoms of the plurality of second bit line trenches 405, and the bottom of the second bit line contact opening 407, and concurrently form the plurality of sacrificial spacers 607 attached to sidewalls of the plurality of second bit line trenches 405 and sidewalls of the second bit line contact opening 407. It should be noted that, in contrast to the configuration of FIG. 18, the plurality of sacrificial spacers 607 may be located in the second bit line contact opening 407 to subsequently form the second bit line contact 401.

Figure 33:
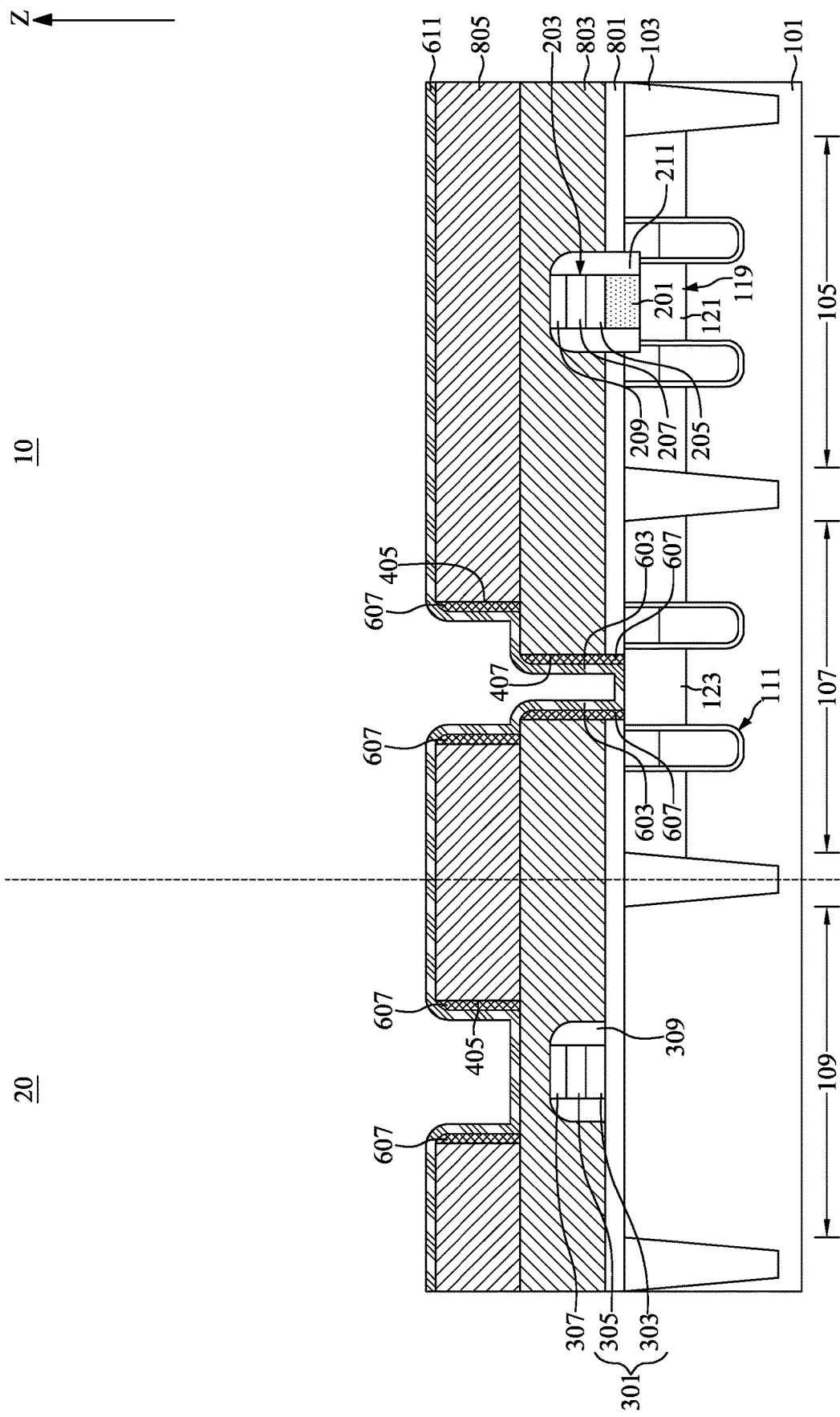
Figure 34:
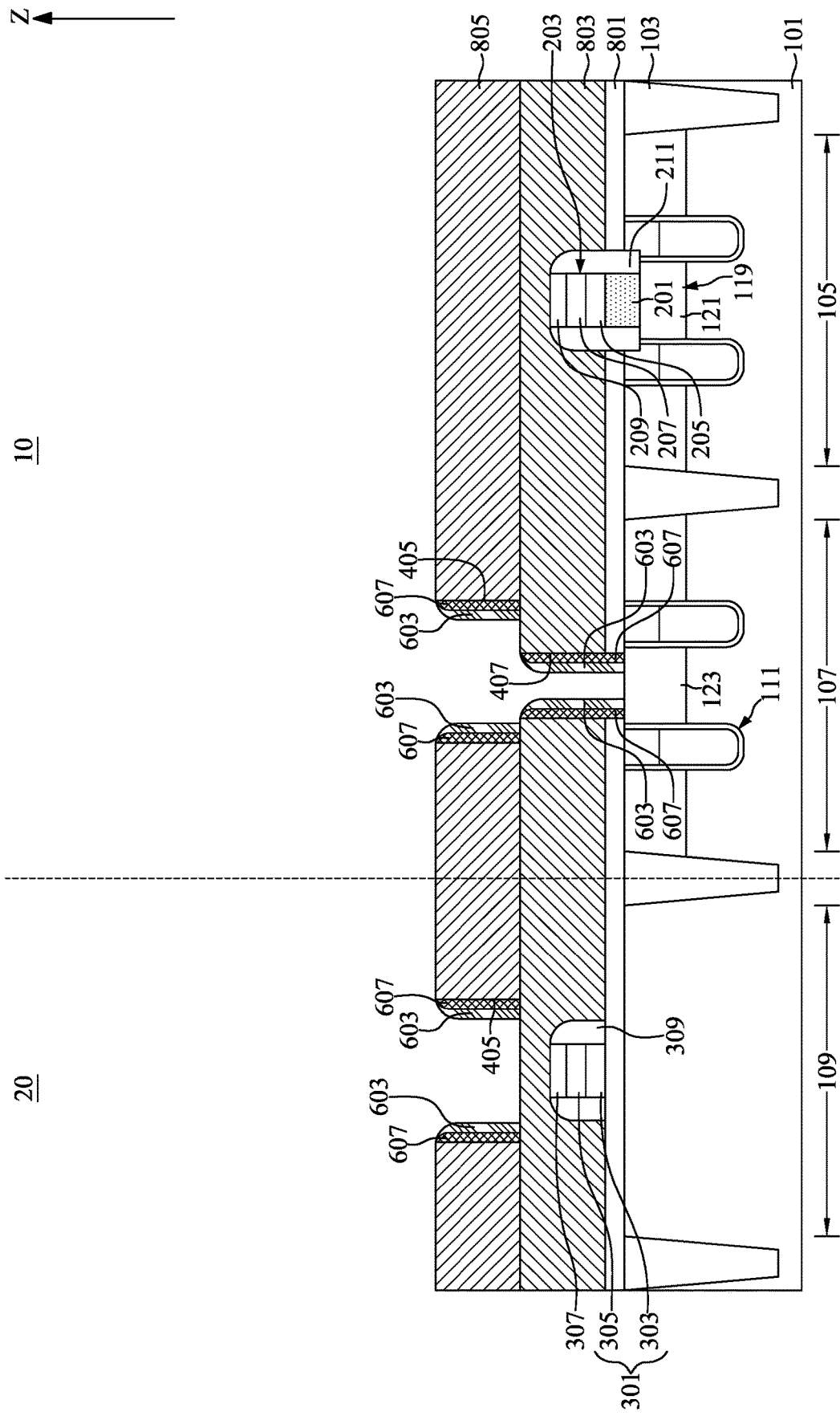

With reference to FIG. 33, a covering spacer layer 611 may be formed on the top surface of the second insulating layer 805, the sidewalls of the plurality of sacrificial spacers 607, the bottoms of the plurality of second bit line trenches 405, and the bottom of the second bit line contact opening 407. With reference to FIG. 34, an etch process, such as an anisotropic dry etch process, may be performed to remove the covering spacer layer 611 formed on the top surface of the second insulating layer 805, the bottoms of the plurality of second bit line trenches 405, and the bottom of the second bit line contact opening 407, and concurrently form the plurality of covering spacers 603 attached to sidewalls of the plurality of sacrificial spacers 607 attached to the sidewalls of the plurality of second bit line trenches 405 and the second bit line contact opening 407.

Figure 35:
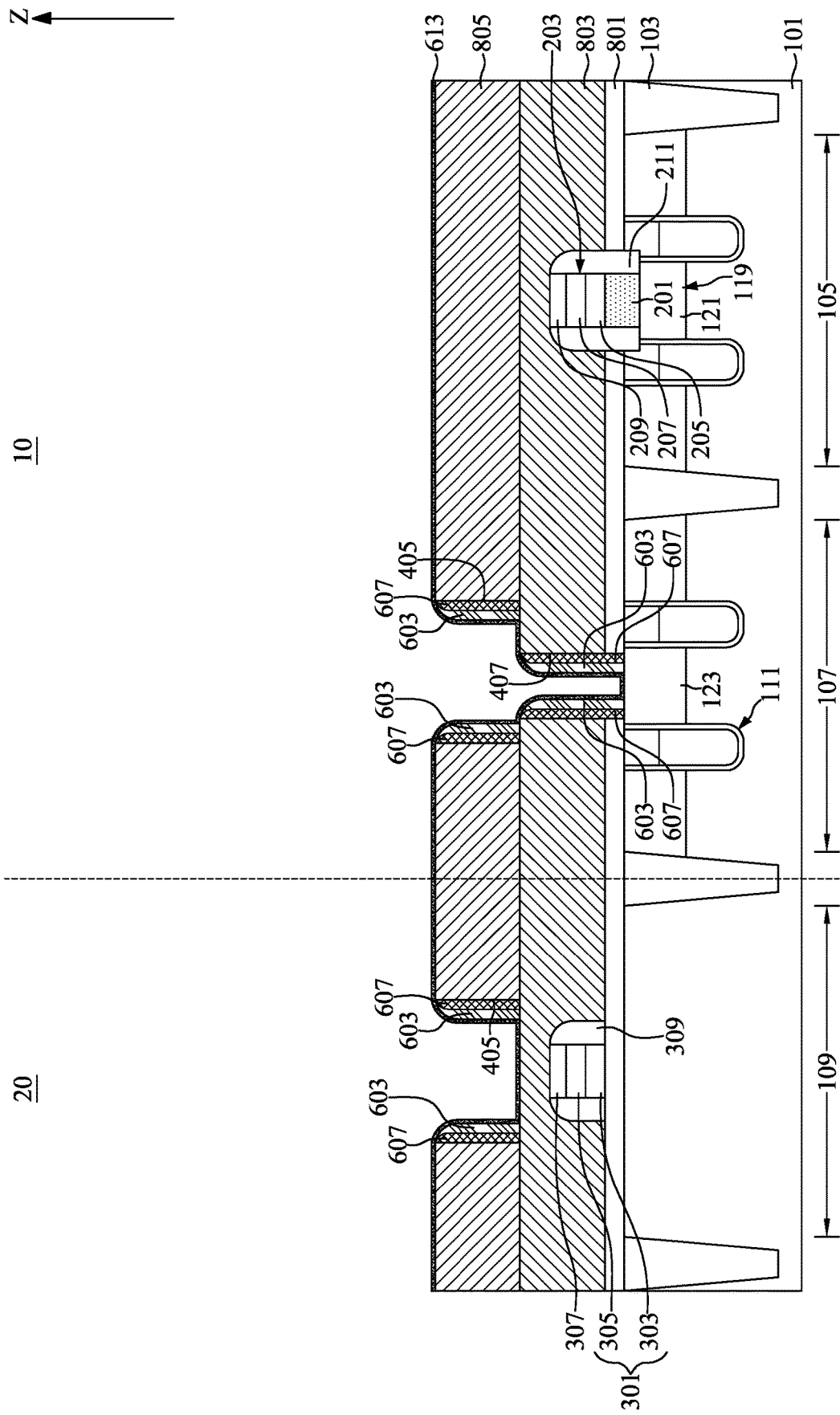
Figure 36:
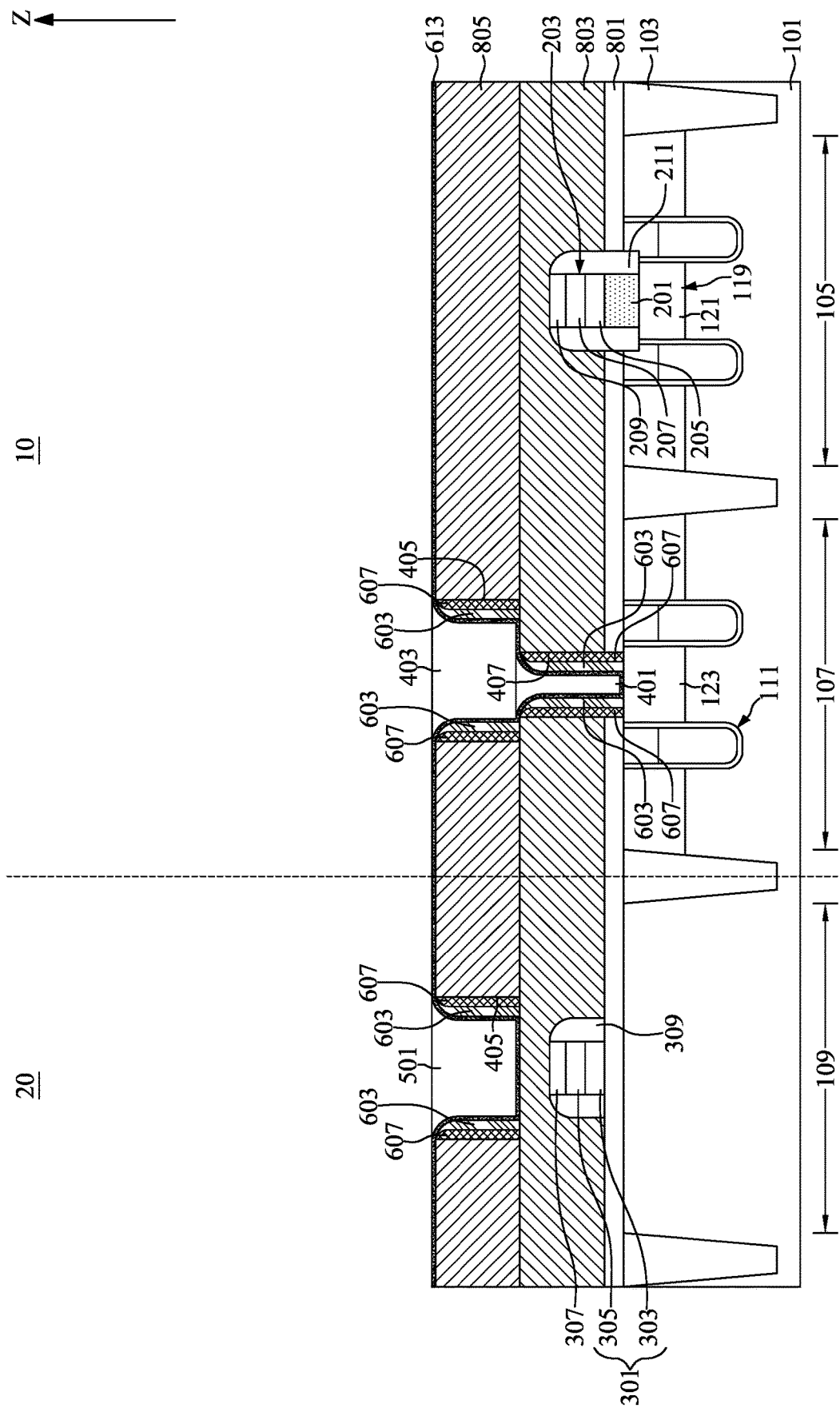
Figure 37:
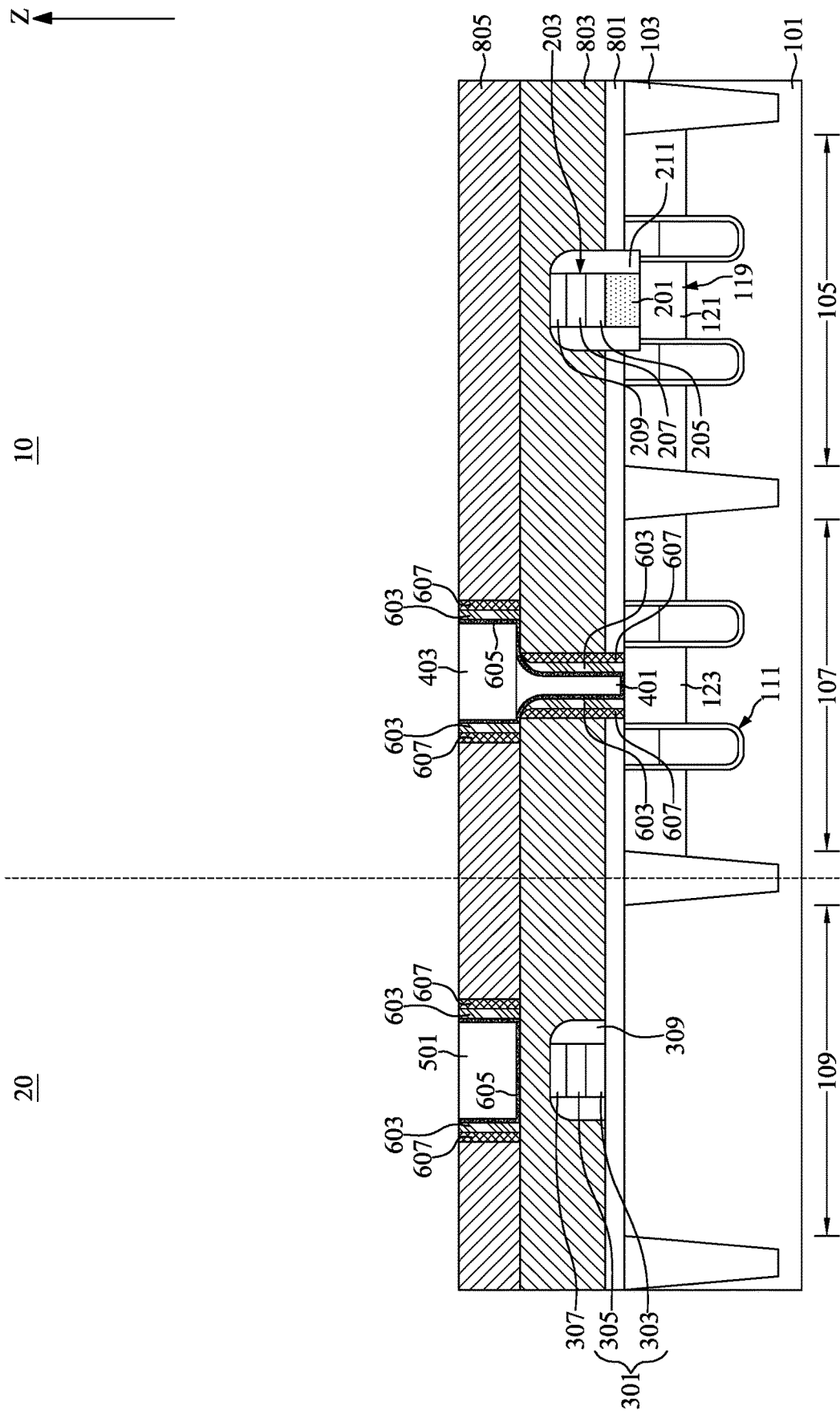
Figure 38:
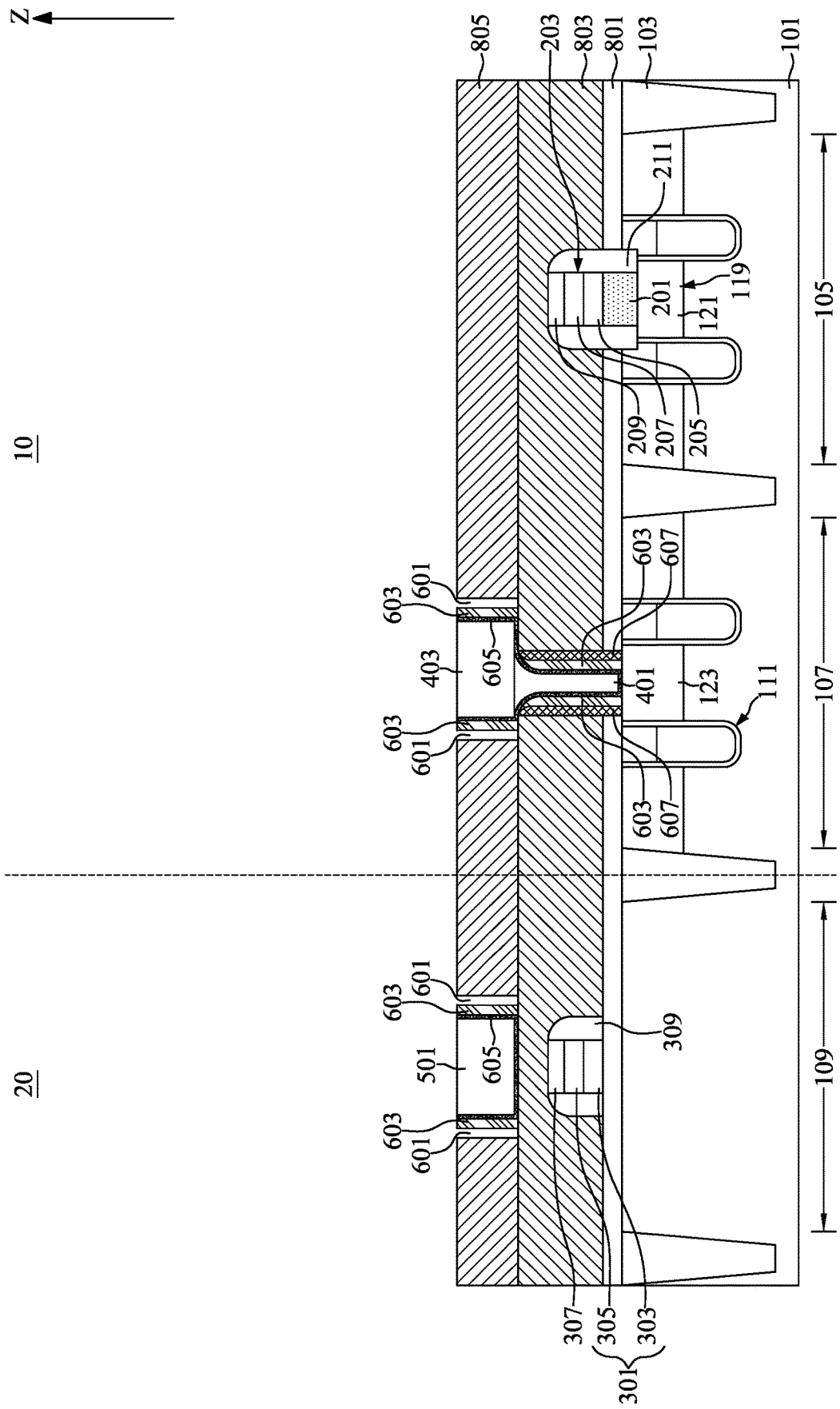
Figure 39:
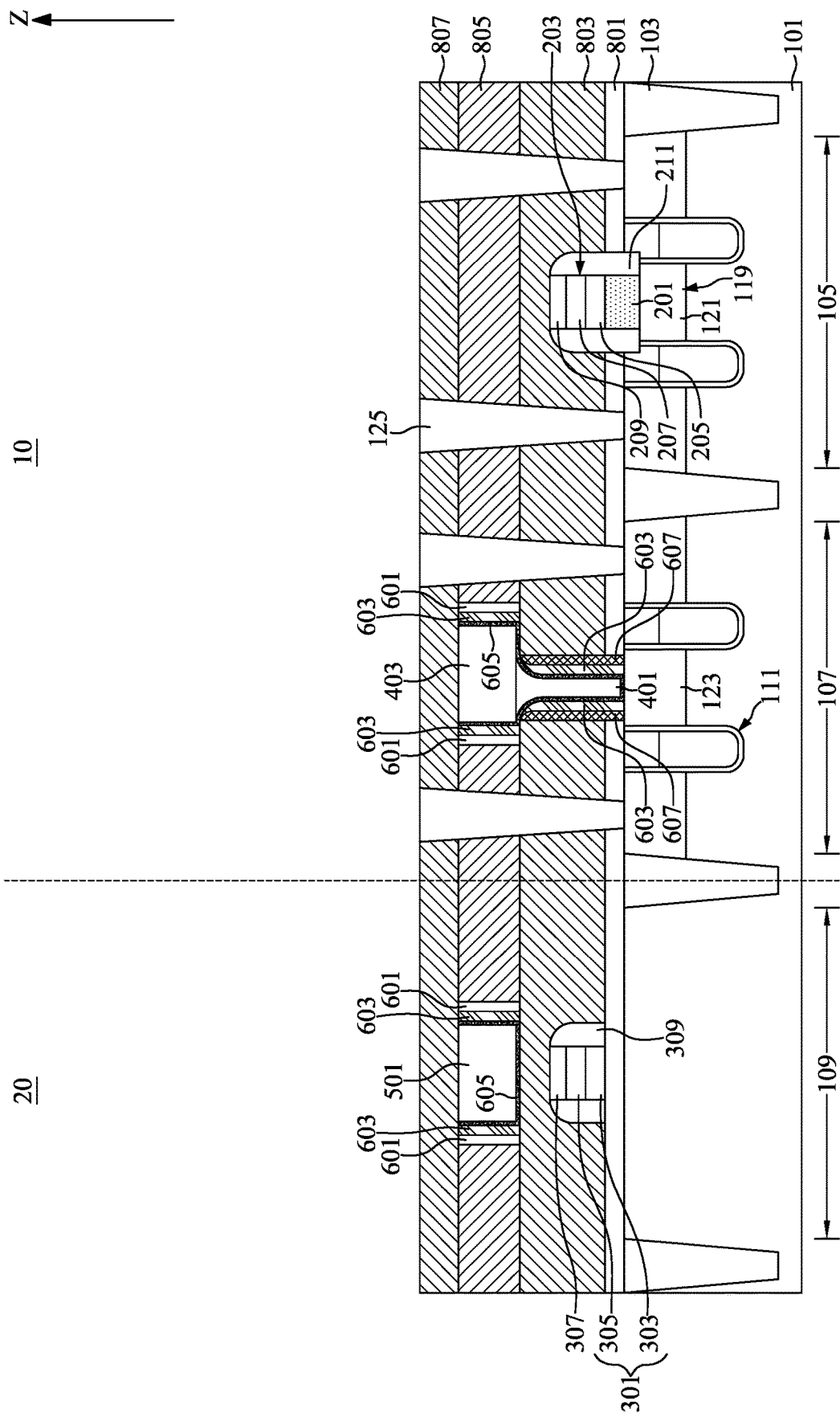
Figure 40:
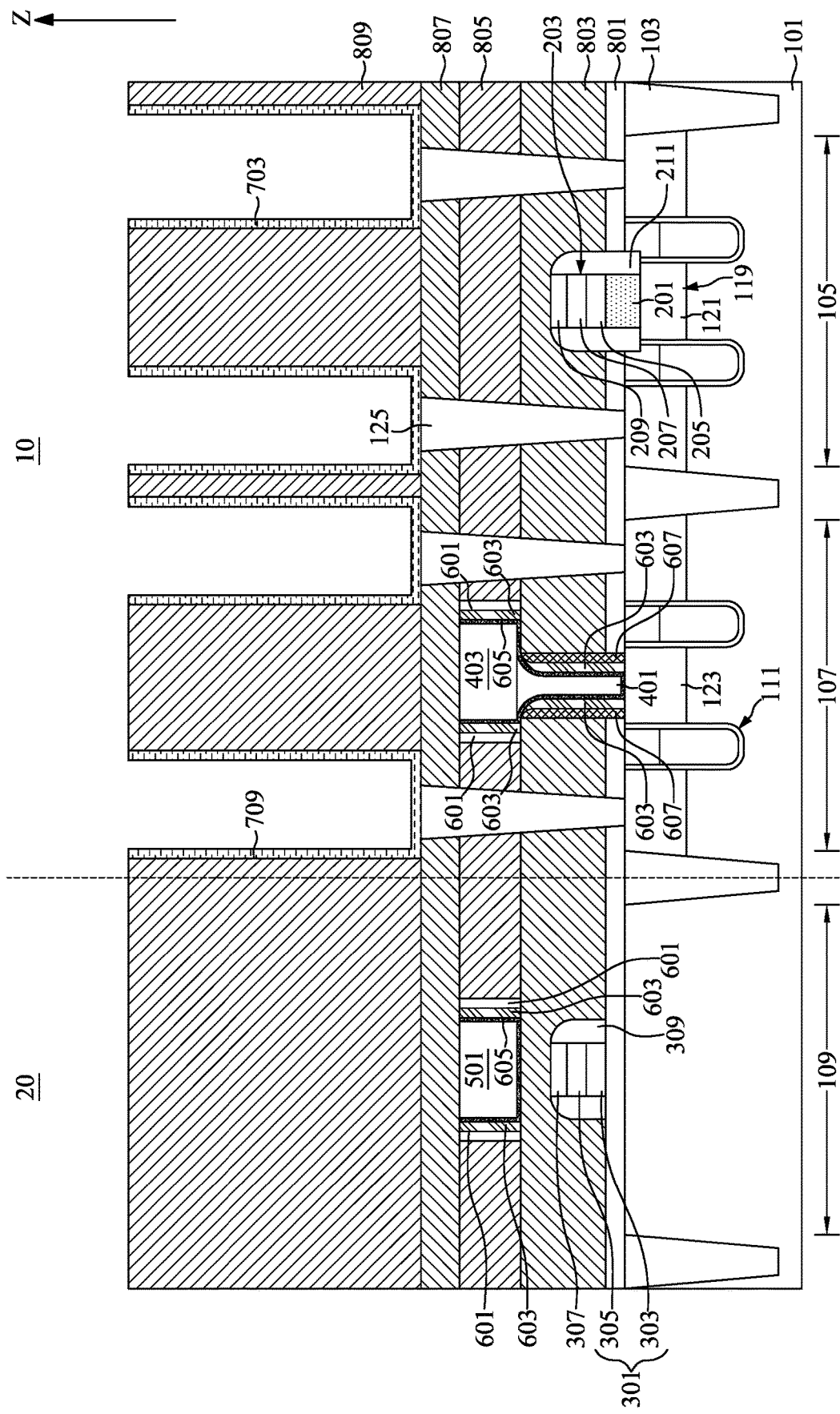
Figure 41:
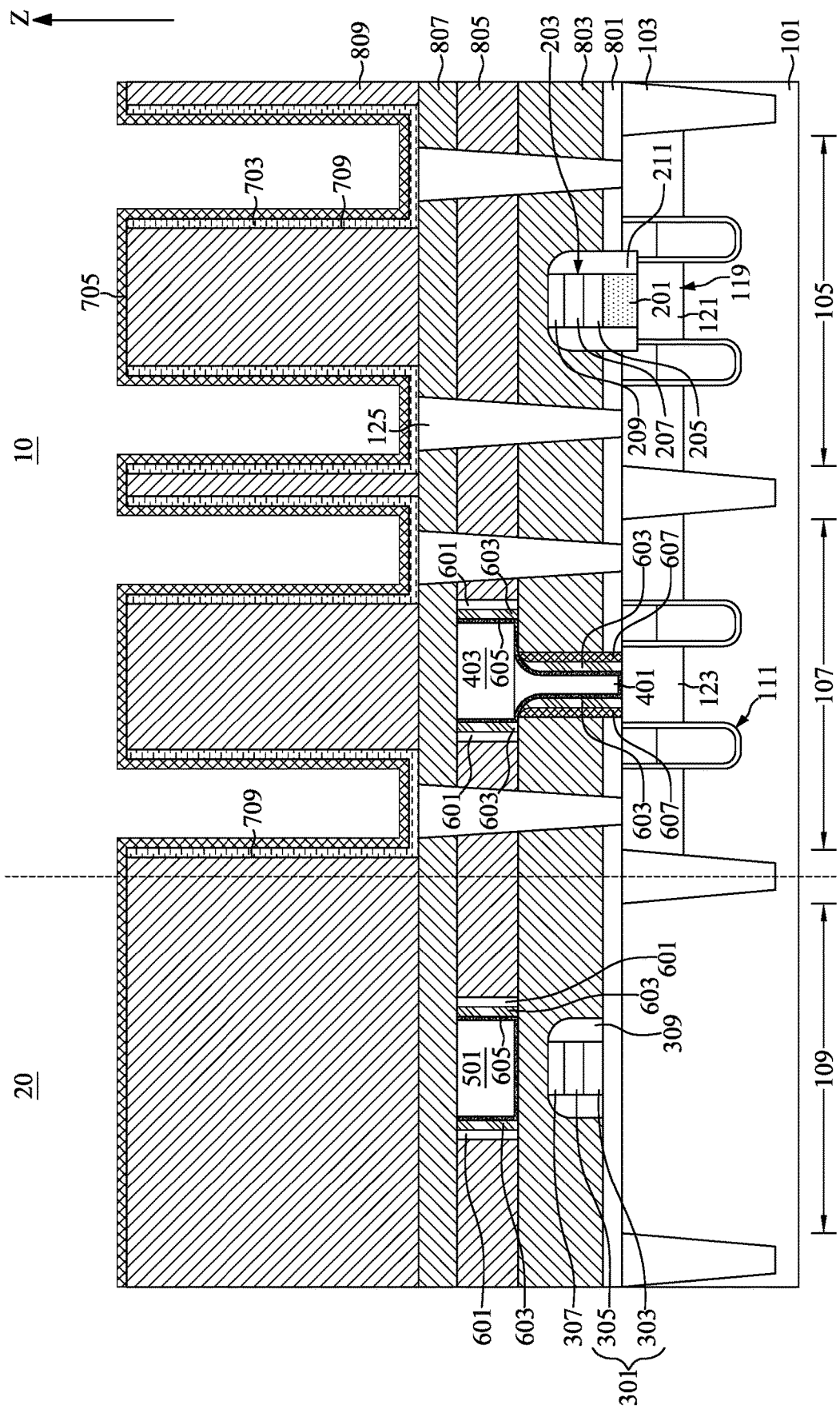

With reference to FIG. 35, a liner layer 613 may be formed on the top surface of the second insulating layer 805, the bottoms of the plurality of second bit line trenches 405, the bottom of the second bit line contact opening 407, and sidewalls of the plurality of covering spacers 603. It should be noted that, in contrast to the configuration of FIG. 21, the liner layer 613 is formed on the plurality of covering spacers 603 formed in the second bit line contact opening 407 to subsequently form the second bit line contact 401. With reference to FIG. 36, a conductive material such as doped polysilicon, metal, metal nitride, or metal silicide may be deposited into the plurality of second bit line trenches 405 and the second bit line contact opening 407 by a metallization process. After the metallization process, a planarization process, such as chemical mechanical polishing, may be performed to remove excess material, provide a substantially flat surface for subsequent processing steps, and conformally form the second bit line contact 401, the second bit line 403, and the second dummy bit line 501. With reference to FIGS. 4 and 37 to 41, formation of the plurality of air gaps 601, the plurality of capacitor plugs 125, and the plurality of capacitor structures 701 may be performed by a procedure similar to that illustrated in FIGS. 24 to 28.

One aspect of the present disclosure provides a semiconductor device with alleviated resistive-capacitive delay induced by the parasitic capacitance originating from adjacent bit lines. The comprises a substrate including a central array area and a marginal array area surrounding the central array area, a first bit line positioned above the central array area, a second bit line positioned above the central array area and higher than and offset from the first bit line, a first dummy bit line positioned above the marginal array area, and a second dummy bit line positioned directly above the first dummy bit line.

Another aspect of the present disclosure provides a method for fabricating a semiconductor device with alleviated resistive-capacitive delay induced by the parasitic capacitance originating from adjacent bit lines. The method comprises providing a substrate comprising a central array area and a marginal array area surrounding the central array area, concurrently forming a first bit line located above the central array area and a first dummy bit line located above the marginal array area, and concurrently forming a second bit line located above the central array area and a second dummy bit line located above the marginal array area, wherein the second bit line is higher than and offset from the first bit line and the second dummy bit line is directly above the first dummy bit line.

Due to the design of the semiconductor device of the present disclosure, the distance between the first bit line and the second bit line may be increased; therefore, the resistive-capacitive delay induced by the parasitic capacitance originating from adjacent bit lines may be alleviated.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for fabricating a semiconductor device, comprising:
    providing a substrate comprising a central array area and a marginal array area surrounding the central array area;
    concurrently forming a first bit line above the central array area and a first dummy bit line above the marginal array area; and
    concurrently forming a second bit line above the central array area and a second dummy bit line above the marginal array area;
    wherein the second bit line is higher than and offset from the first bit line and the second dummy bit line is directly above the first dummy bit line.

2. The method for fabricating the semiconductor device of claim 1, further comprising forming a plurality of air gaps adjacent to sidewalls of the second bit line and the second dummy bit line.

3. The method for fabricating the semiconductor device of claim 2, further comprising forming a plurality of capacitor structures at the central array area.

4. The method for fabricating the semiconductor device of claim 3, wherein forming a first bit line comprises forming a first bit line bottom conductive layer above the central array area and a first bit line top conductive layer on the first bit line bottom conductive layer.

5. The method for fabricating the semiconductor device of claim 4, further comprising forming a first bit line contact below the first bit line, wherein a lower portion of the first bit line contact is buried in the substrate.

6. The method for fabricating the semiconductor device of claim 5, further comprising forming a first bit line capping layer above the first bit line, wherein the first bit line capping layer is formed of silicon oxide, silicon nitride, silicon oxynitride, silicon nitride oxide, or fluoride-doped silicate.

7. The method for fabricating the semiconductor device of claim 6, further comprising forming first bit line spacers attached to sidewalls of the first bit line, wherein the first bit line spacers are formed of silicon oxide, silicon nitride, silicon oxynitride, or silicon nitride oxide.

8. The method for fabricating the semiconductor device of claim 7, further comprising forming a plurality of word lines in the central array area.

9. The method for fabricating the semiconductor device of claim 8, further comprising forming a plurality of air gaps adjacent to sidewalls of the second bit line and sidewalls of the second dummy bit line.

10. The method for fabricating the semiconductor device of claim 9, further comprising forming a plurality of covering spacers adjacent to the sidewalls of the second bit line and the sidewalls of the second dummy bit line, wherein the plurality of covering spacers are formed of silicon oxide, silicon nitride, silicon oxynitride, or silicon nitride oxide.

11. The method for fabricating the semiconductor device of claim 10, further comprising forming a plurality of liners between the sidewalls of the second bit line and the plurality of covering spacers and between the sidewalls of the second dummy bit line and the plurality of covering spacers.

12. The method for fabricating the semiconductor device of claim 11, further comprising forming a plurality of capacitor structures above the central array area and the marginal array area.

13. The method for fabricating the semiconductor device of claim 12, further comprising forming a plurality of capacitor plugs between the plurality of capacitor structures and the substrate.

14. The method for fabricating the semiconductor device of claim 13, further comprising forming a second bit line contact above the central array area, wherein the second bit line is asymmetrically on the second bit line contact.

15. The method for fabricating the semiconductor device of claim 14, further comprising forming a second bit line contact below the second bit line, and a plurality of sacrificial spacers adjacent to sidewalls of the second bit line contact, wherein the plurality of sacrificial spacers may be formed of doped oxide.

16. The method for fabricating the semiconductor device of claim 15, further comprising forming a plurality of covering spacers adjacent to the sidewalls of the second bit line, the sidewalls of the second dummy bit line, and the sidewalls of the second bit line contact.

17. The method for fabricating the semiconductor device of claim 16, further comprising forming a plurality of liners between the sidewalls of the second bit line and the plurality of covering spacers, between the sidewalls of the second dummy bit line and the plurality of covering spacers, and between the sidewalls of the second bit line contact and the plurality of covering spacers.

* * * * *